(12) United States Patent
Bai et al.

(10) Patent No.: US 10,304,840 B2
(45) Date of Patent: May 28, 2019

(54) SEMICONDUCTOR DEVICE HAVING STRESSOR AND METHOD OF MANUFACTURING THE SAME

(71) Applicant: SAMSUNG ELECTRONICS CO., LTD., Suwon-si, Gyeonggi-do (KR)

(72) Inventors: Keun-hee Bai, Suwon-si (KR); Myeong-cheol Kim, Suwon-si (KR); Kwan-heum Lee, Suwon-si (KR); Do-hyoung Kim, Hwaseong-si (KR); Jin-wook Lee, Seoul (KR); Seung-mo Ha, Seoul (KR); Dong-Hoon Khang, Daegu (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/084,785

(22) Filed: Mar. 30, 2016

(65) Prior Publication Data

US 2016/0358925 A1    Dec. 8, 2016

(30) Foreign Application Priority Data

Jun. 2, 2015  (KR) .................. 10-2015-0078246

(51) Int. Cl.
| | |
|---|---|
| *H01L 27/11* | (2006.01) |
| *H01L 27/088* | (2006.01) |
| *H01L 29/78* | (2006.01) |
| *H01L 21/8234* | (2006.01) |
| *H01L 29/66* | (2006.01) |
| *H01L 29/08* | (2006.01) |
| *H01L 29/161* | (2006.01) |
| *H01L 29/165* | (2006.01) |

(52) U.S. Cl.
CPC .. *H01L 27/1104* (2013.01); *H01L 21/823412* (2013.01); *H01L 21/823418* (2013.01); *H01L 21/823431* (2013.01); *H01L 27/0886* (2013.01); *H01L 27/1116* (2013.01); *H01L 29/0847* (2013.01); *H01L 29/66545* (2013.01); *H01L 29/7848* (2013.01); *H01L 21/823425* (2013.01); *H01L 29/161* (2013.01); *H01L 29/165* (2013.01)

(58) Field of Classification Search
CPC ............ H01L 27/1104; H01L 29/7848; H01L 29/7853
See application file for complete search history.

(56) References Cited

U.S. PATENT DOCUMENTS

| | | |
|---|---|---|
| 7,902,035 B2 | 3/2011 | Yu et al. |
| 8,263,462 B2 | 9/2012 | Hung et al. |

(Continued)

FOREIGN PATENT DOCUMENTS

KR    10-1229186 B1    1/2013

*Primary Examiner* — Asok K Sarkar
*Assistant Examiner* — Grant S Withers
(74) *Attorney, Agent, or Firm* — Lee & Morse P.C.

(57) ABSTRACT

A semiconductor device includes a substrate, a fin active region pattern on the substrate, the fin active region pattern including an upper region and a lower region, a device isolation layer pattern surrounding the fin active region pattern, a gate pattern on the upper region of the fin active region pattern, and a stressor on the lower region of the fin active region pattern, wherein a top surface of the device isolation layer pattern is lower than a top surface of the upper region and higher than a top surface of the lower region.

20 Claims, 44 Drawing Sheets

(56) References Cited

U.S. PATENT DOCUMENTS

| | | | |
|---|---|---|---|
| 8,373,238 B2 | 2/2013 | Lee et al. | |
| 8,441,074 B2 | 5/2013 | Rachmady et al. | |
| 8,673,709 B2 | 3/2014 | Lee et al. | |
| 8,748,993 B2 | 6/2014 | Lee et al. | |
| 9,087,725 B2 | 7/2015 | Lee et al. | |
| 2010/0163971 A1 | 7/2010 | Hung et al. | |
| 2010/0276756 A1 | 11/2010 | Rachmady et al. | |
| 2012/0299110 A1 | 11/2012 | Hung et al. | |
| 2013/0049138 A1 | 2/2013 | Zhu et al. | |
| 2013/0221491 A1 | 8/2013 | Wann et al. | |
| 2014/0106528 A1 | 4/2014 | Quyang et al. | |
| 2014/0239255 A1* | 8/2014 | Kang | H01L 29/775 257/24 |
| 2014/0264489 A1* | 9/2014 | Wong | H01L 29/785 257/288 |
| 2014/0367795 A1 | 12/2014 | Cai et al. | |
| 2015/0270401 A1* | 9/2015 | Huang | H01L 29/7851 257/192 |
| 2016/0064381 A1* | 3/2016 | Chang | H01L 29/7848 257/192 |
| 2016/0190017 A1* | 6/2016 | Lee | H01L 21/845 257/192 |
| 2016/0308048 A1* | 10/2016 | Ching | H01L 29/7848 |
| 2016/0359043 A1* | 12/2016 | Chen | H01L 29/7851 |
| 2017/0207218 A1* | 7/2017 | Chang | H01L 21/02532 |
| 2017/0352596 A1* | 12/2017 | Lee | H01L 29/785 |

* cited by examiner

SEMICONDUCTOR DEVICE HAVING STRESSOR AND METHOD OF MANUFACTURING THE SAME

CROSS-REFERENCE TO RELATED APPLICATION

Korean Patent Application No. 10-2015-0078246, filed on Jun. 2, 2015, in the Korean Intellectual Property Office, and entitled: "Semiconductor Device Having Stressor and Method of Manufacturing the Same," is incorporated by reference herein in its entirety.

BACKGROUND

1. Field

Example embodiments relate to semiconductor devices having a stressor and/or methods of manufacturing the same.

2. Description of the Related Art

In order to improve electrical characteristic of a semiconductor device, the semiconductor device may include a stressor. The stressor may be formed through forming a trench in a fin active region and growing an epitaxial layer in the trench. Generally, the electrical characteristics of the semiconductor device vary in accordance with a volume of the stressor. In other words, an increase in the volume of the stressor improves the electrical characteristics of the semiconductor device.

SUMMARY

According to some example embodiments, a semiconductor device may include a fin active region pattern including an upper region and a lower region, a device isolation layer pattern surrounding the fin active region pattern, a gate pattern on the upper region, and a stressor on the lower region.

A top surface of the device isolation layer pattern may be lower than a top surface of the upper region and higher than a top surface of the lower region.

The stressor may be disposed on the lower region adjacent to the device isolation layer pattern and may be spaced apart from another adjacent stressor by the device isolation layer pattern interposed therebetween.

The lower region of the fin active region pattern may be surrounded by the device isolation layer pattern, the upper region of the fin active region pattern may protrude from the top surface of the device isolation layer pattern and the gate pattern may contact the top surface and sidewalls of the upper region and may extend above the device isolation layer pattern.

A top surface of the device isolation layer pattern adjacent to the upper region may be disposed at substantially the same height as a top surface of the device isolation layer pattern adjacent to the lower region.

The top surface of the upper region may be higher than the top surface of the lower region and a top surface of the stressor may be higher than the top surface of the device isolation layer pattern.

The upper region of the fin active region pattern, the stressor and the gate pattern may constitute a PMOS transistor of an SRAM memory device.

The stressor may cover a side surface of the device isolation layer pattern.

According to some example embodiments, a semiconductor device may include a plurality of first fin active region patterns in a first region, each of the plurality of first fin active region patterns including a first upper region and a first lower region, a plurality of second fin active region patterns in a second region, each of the plurality of second fin active region patterns including a second upper region and a second lower region, a first device isolation layer pattern surrounding the first fin active region patterns and a second device isolation layer pattern surrounding the second fin active region patterns, and a first stressor on the first lower region and a second stressor on the second lower region.

A top surface of the first device isolation layer pattern may be substantially coplanar with or may be higher than a top surface of the first lower region and a top surface of the second device isolation layer pattern may be higher than a top surface of the second lower region.

The top surface of the first device isolation layer pattern may be lower than a top surface of the first upper region, the top surface of the second device isolation layer pattern may be lower than a top surface of the second upper region, the top surface of the first upper region may be substantially coplanar with the top surface of the second upper region and the top surface of the first device isolation layer pattern may be lower than the top surface of the second device isolation layer pattern.

The first lower region of the first fin active region pattern may be surrounded by the first device isolation layer pattern and the first upper region of the first fin active region pattern may protrude from the top surface of the first device isolation layer pattern, the second lower region of the second fin active region pattern may be surrounded by the second device isolation layer pattern and the second upper region of the second fin active region pattern may protrude from the top surface of the second device isolation layer pattern, the first upper region may have a first fin height ranging from the top surface of the first upper region to the top surface of the first device isolation layer pattern and the second upper region may have a second fin height ranging from the top surface of the second upper region to the top surface of the second device isolation layer pattern and less than the first fin height.

The device may further include a first gate pattern on the first upper region and a second gate pattern on the second upper region, the first gate pattern may contact the top surface and sidewalls of the first upper region and may extend above the first device isolation layer pattern and the second gate pattern may contact the top surface and sidewalls of the second upper region and may extend above the second device isolation layer pattern.

The first stressor may be disposed on the first lower region adjacent to the first device isolation layer pattern and may contact another adjacent first stressor, the second stressor may be disposed on the second lower region adjacent to the second device isolation layer pattern and may be spaced apart from another adjacent second stressor by the second device isolation layer pattern interposed therebetween.

A top surface of the first upper region may be higher than the top surface of the first lower region and a top surface of the first stressor may be higher than the top surface of the first device isolation layer pattern, a top surface of the second upper region may be higher than the top surface of the second lower region and a top surface of the second stressor may be higher than the top surface of the second device isolation layer pattern.

The first region may include a PMOS transistor region of a logic device and the second region may include a PMOS transistor region of an SRAM memory device.

The top surface of the first lower region may be disposed at substantially the same height as the top surface of the second lower region.

According to some example embodiments, a method of manufacturing a semiconductor device may include providing a substrate including a first region and a second region, forming a first device isolation layer pattern and a second isolation layer pattern in the first region and the second region of the substrate, respectively, selectively removing an upper portion of the second device isolation layer pattern of the second region, forming a first fin active region pattern and a second fin active region pattern in the first region and the second region, respectively, by partially removing the first and second device isolation layer patterns to expose an upper portion of the substrate, forming first trench in the first fin active region pattern by partially removing the first fin active region pattern, the first trench having a bottom surface lower than a top surface of the first device isolation layer pattern, and forming a first stressor on the bottom surface of the first trench such that the first stressor is self-aligned by the first device isolation layer pattern.

The first region may include a PMOS transistor region of an SRAM memory device and the second region may include a PMOS transistor region of the logic device.

The method may further include forming a second trench in the second fin active region pattern by partially removing the second fin active region pattern and forming a second stressor in the second trench, the partially removing the first and second fin active region patterns may include selectively forming a first gate pattern and a second gate pattern on the first fin active region pattern and the second fin active region pattern, respectively and concurrently etching a portion of each of the first and second fin active region patterns using the first and second gate patterns as etch masks.

Each of the first and second gate patterns may include a preliminary gate pattern and the method may further include, after forming the first trench and the second trench, removing the first and second gate patterns and forming a third gate pattern and a fourth gate pattern on the first fin active region pattern and the second fin active region pattern, respectively.

The forming of the second trench may be performed such that a bottom surface of the second trench is disposed at substantially the same height as or is lower than a top surface of the second device isolation layer pattern.

A top surface of the first fin active region pattern may be disposed at substantially the same height as a top surface of the second fin active region pattern and the top surface of the first fin active region pattern may be higher than the bottom surface of the first trench and the top surface of the second active region pattern may be higher than a bottom surface of the second trench.

The forming of the first and second trenches may be performed such that the bottom surface of the first trench is disposed at substantially the same height as a bottom surface of the second trench.

The first stressor may be spaced apart from another adjacent first stressor by the first device isolation layer pattern interposed therebetween and the second stressor may contact another adjacent second stressor.

The forming of the first fin active region pattern may include forming a first lower region surrounded by the first device isolation layer pattern and a first upper region protruding from the top surface of the first device isolation layer pattern, the forming of the second fin active region pattern may include forming a second lower region surrounded by the second device isolation layer pattern and a second upper region protruding from a top surface of the second device isolation layer pattern, and the forming of the first upper region and the second upper region may be performed such that a first fin height ranging from the top surface of the first upper region to the top surface of the first device isolation layer pattern is less than a second fin height ranging from the top surface of the second upper region to the top surface of the second device isolation layer pattern.

The selectively removing of the upper portion of the second device isolation layer pattern of the second region may include forming the second device isolation layer pattern having a top surface lower than the top surface of the first device isolation layer pattern and the first and second fin active region patterns may be formed to be substantially coplanar with each other.

According to some example embodiments, a method of manufacturing a semiconductor device may include providing a substrate including a first region and a second region, forming a mask layer on the substrate, forming a first device isolation layer pattern and a second device isolation layer pattern in the first region and the second region, respectively, by selectively etching the mask layer and the substrate, removing a portion of each of the mask layer and the second device isolation layer pattern in the second region, removing the mask layer in the first region and a remaining portion of the mask layer in the second region, forming a plurality of first fin active region patterns in the first region and a plurality of second fin active region patterns in the second region by removing an upper portion of each of the first device isolation layer pattern and the second device isolation layer pattern, forming first gate patterns on the first fin active region patterns and second gate patterns on the second fin active region patterns, forming a first trench by partially etching the first fin active region patterns using the first gate patterns as etch masks and a second trench by partially etching the second fin active region patterns using the second gate patterns as etch masks, and forming first stressors in the first trench and second stressors in the second trench, a top surface of the first device isolation layer pattern is higher than a bottom surface of the first trench and the first stressors are formed in a self-aligned manner by the first device isolation layer pattern.

The forming of the mask layer on the substrate may include sequentially forming a silicon oxide layer and a silicon nitride layer on the substrate.

The removing of the portion of each of the mask layer and the second device isolation layer pattern in the second region may include removing at least half the total thickness of the silicon nitride layer in the second region using a dry or wet etching process, the removing of the mask layer in the first region and the remaining portion of the mask layer in the second region may include removing the silicon nitride layer in the first region and the remaining silicon nitride layer in the second region through a wet etching process, and the removing of the respective upper portions of the first device isolation layer pattern and the second device isolation layer pattern for forming the first and second fin active region patterns may include removing the respective upper portions of the first and second device isolation layer patterns together with the silicon oxide layer through a dry and/or wet etching process.

Respective ones of the first and second gate patterns may include preliminary gate patterns and the method may further include, after forming the first and second trenches, removing the first and second gate patterns and forming third gate patterns and fourth gate patterns on the first fin active region patterns and the second fin active region patterns, respectively.

The forming of the first stressors in the first trench and the second stressors in the second trench may include conformally forming a first epitaxial layer along inner sidewalls and a bottom surface of each of the first and second trenches, forming a second epitaxial layer on the first epitaxial layer and forming a third epitaxial layer on the second epitaxial layer, and a silicon content of the first epitaxial layer is greater than a silicon content of the second epitaxial layer and is less than a silicon content of the third epitaxial layer.

The top surface of the first device isolation layer pattern may be lower than a top surface of the first fin active region pattern and may be higher than the bottom surface of the first trench, a top surface of the second device isolation layer pattern may be lower than a top surface of the second fin active region pattern and may be disposed at substantially the same height as or may be higher than a bottom surface of the second trench, and the top surface of the first device isolation layer pattern may be higher than the top surface of the second device isolation layer pattern.

According to some example embodiments, a semiconductor device may include a substrate, a fin active region pattern on the substrate along a first direction, the fin active region pattern including an upper region and a lower region, a device isolation layer pattern surrounding the fin active region pattern, a top surface of the device isolation layer pattern is lower than a top surface of the upper region and higher than a top surface of the lower region, a gate pattern on the upper region of the fin active region pattern, and a stressor on the lower region of the fin active region pattern, the stressor being between two portions of the device isolation layer pattern that are spaced apart from each other along a second direction perpendicular to the first direction.

The upper and lower regions of the fin active region pattern may alternate along the first direction, a portion of the device isolation layer pattern extending above the lower region to at least partially overlap the stressor.

The device isolation layer pattern may extend along the first direction to contact opposite sidewalls of the fin active region pattern, the stressor being surrounded by the device isolation layer pattern and the upper region of the fin active region pattern.

A portion of the device isolation layer pattern overlapping the stressor may separate between two stressor adjacent to each other along the second direction.

A plurality of stressors and portions of the device isolation layer pattern may alternate along the second direction.

BRIEF DESCRIPTION OF THE DRAWINGS

Features will become apparent to those of ordinary skill in the art by describing in detail exemplary embodiments with reference to the attached drawings, in which:

FIG. 3A is a cross-sectional view taken along line I-I' of FIG. 2A, FIG. 3B is a cross-sectional view taken along line II-II' of FIG. 2A, and FIG. 3C is a cross-sectional view taken along line III-III' of FIG. 2B.

FIGS. 6A through 15A, FIGS. 6B through 15B, and FIGS. 6C through 15C illustrate views of stages in a method of manufacturing a semiconductor device of FIGS. 1, 2A, 2B, 2C, 3A, 3B, 3C, 4A, 4B, 5A, and/or 5B. FIGS. 6A through 15A are cross-sectional views corresponding to a cross-section taken along the line I-I' of FIG. 2A. FIG. 6B through FIG. 15B are cross-sectional views corresponding to a cross-section taken along the line II-II' of FIG. 2A. FIGS. 6C through 15C are cross-sectional views corresponding to a cross-section taken along the line III-III' of FIG. 2B.

DETAILED DESCRIPTION

Figure 1:
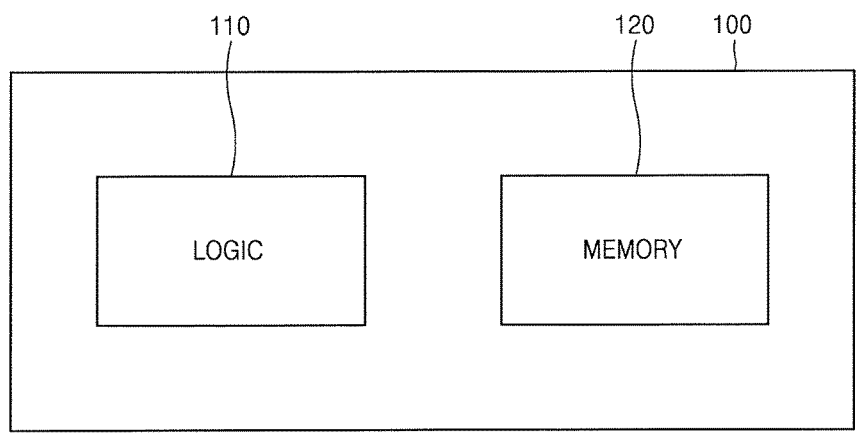
FIG. 1 illustrates a schematic view of a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Also, though terms "first" and "second" are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

The following describes details of example embodiments with reference to accompanying drawings.

FIG. 1 is a view of a semiconductor device 100 according to an example embodiment.

Referring to FIG. 1, the semiconductor device 100 may include a logic region 110 and a memory region 120.

In an example embodiment, the logic region 110 may include a PMOS transistor region. In another example, the logic region 110 may include an NMOS transistor region.

In an example embodiment, the memory region 120 may be a static random access memory (SRAM) device region. As an example, the SRAM memory device region may include a PMOS transistor region. As another example, the SRAM memory device region may include an NMOS transistor region. As yet another example embodiment, the memory region 120 may be a region for forming other memory device, e.g., dynamic random access memory (DRAM), magnetic random access memory (MRAM), resistive random access memory (RRAM), and/or phase-change random access memory (PRAM).

Figure 2A:
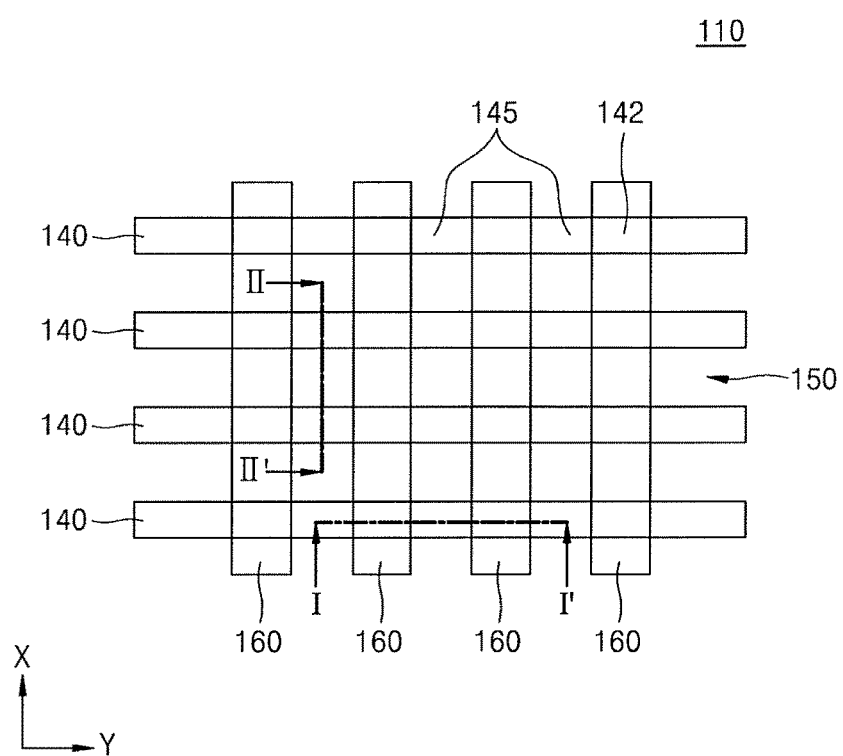
FIGS. 2A and 2B illustrate layout views of the semiconductor device of FIG. 1.
Figure 2B:
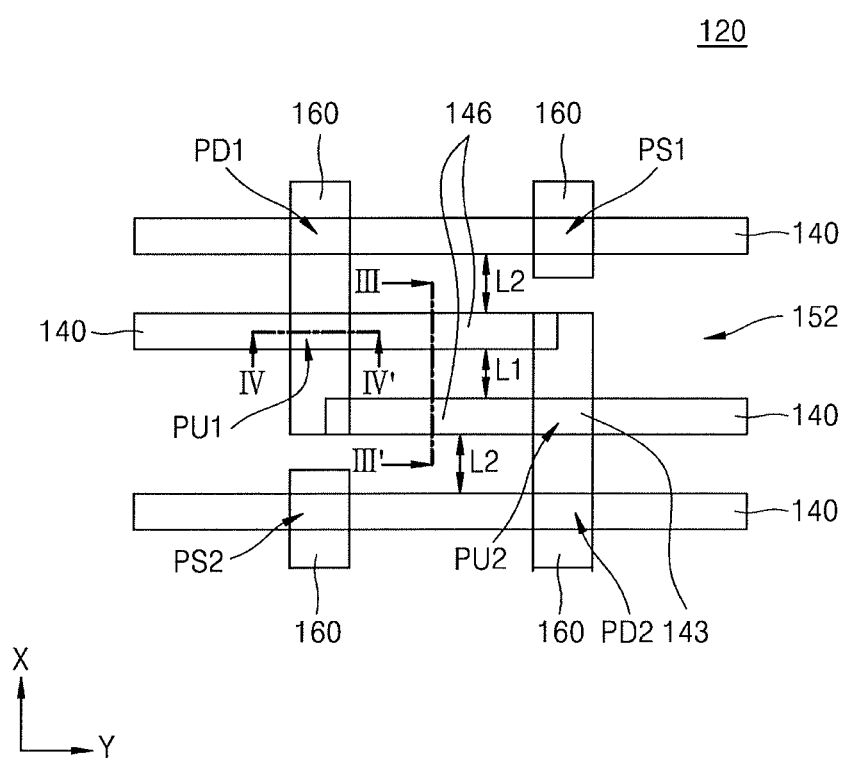
Figure 2C:
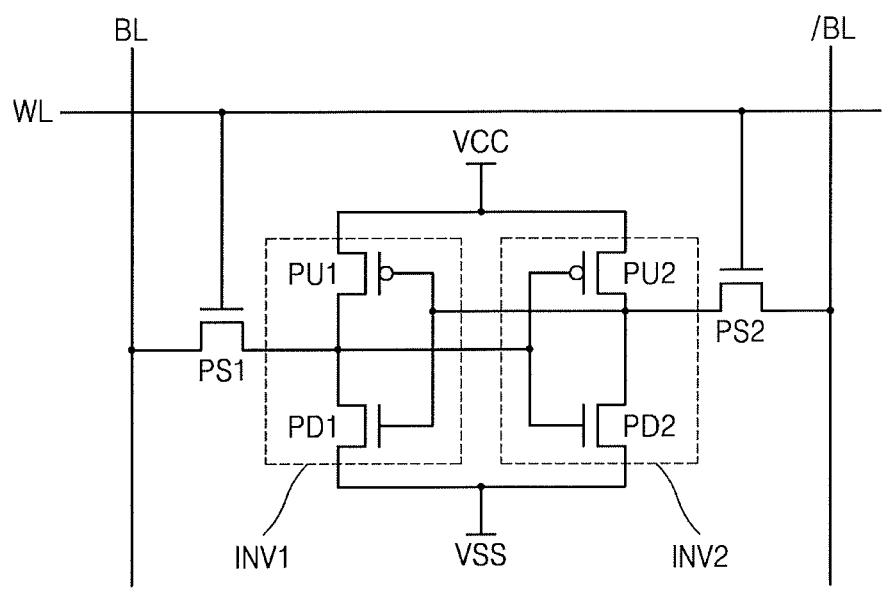
FIG. 2C is an example of an equivalent circuit diagram of the semiconductor device of FIG. 1.

FIG. 2A is a layout view of the logic region 110, FIG. 2B is a layout view of the memory region 120, and FIG. 2C is an equivalent circuit diagram of the SRAM memory device region as an example of the memory region 120.

Referring to FIG. 2C, the SRAM memory device region may include a pair of inverters INV1 and INV2 connected in parallel between a power supply node Vcc and a ground node Vss, and a first pass transistor PS1 and a second pass transistor PS2 connected to output nodes of the respective inverters INV1 and INV2.

The first pass transistor PS1 and the second pass transistor PS2 may be connected to a bit line BL and a complementary bit line /BL, respectively. Gates of the first pass transistor PS1 and the second pass transistor PS2 may be connected to a word line WL. The first pass transistor PS1 and the second pass transistor PS2 may be NMOS transistors.

The first inverter INV1 may include a first pull-up transistor PU1 and a first pull-down transistor PD1 which are connected in series, and the second inverter INV2 may include a second pull-up transistor PU2 and a second pull-down transistor PD2 which are connected in series. The first pull-up transistor PU1 and the second pull-up transistor PU2 may be PMOS transistors, and the first pull-down transistor PD1 and the second pull-down transistor PD2 may be NMOS transistors.

Furthermore, the first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

Referring to FIG. 2A, the logic region 110 may include a plurality of fin active region patterns 140 and a plurality of gate patterns 160. The plurality of fin active region patterns 140 may extend in a second direction (Y direction) parallel to a top surface of a substrate 130 (Refer to e.g., FIGS. 3A through 3C) and have a line or bar shape. The plurality of gate patterns 160 may extend in a first direction (X direction) parallel to the top surface of the substrate 130 and vertically intersecting the fin active region pattern 140. The plurality of fin active region patterns 140 may be arranged along the first direction (X direction) and the plurality of gate patterns 160 may be arranged along the second direction (Y direction). The fin active region patterns 140 may be surrounded by a first device isolation layer pattern 150. Each of the fin active region patterns 140 may include a first upper region 142 that overlaps the gate pattern 160 and a first lower region 145 that is not overlapped with the gate pattern 160. The first lower region 145 may be disposed between adjacent gate patterns 160. A top surface of the first upper region 142 may be higher than a top surface of the first lower region 145. For example, the first upper region 142 may be a region for forming a channel and the first lower region 145 may be a region for forming a first source/drain region 147 (refer to e.g., FIGS. 3A through 3C). The first source/drain region 147 may include a first stressor 147, i.e., the first source/drain region 147 may be the first stressor 147 to be used interchangeable hereinafter.

In an example embodiment, the first lower region 145 may be surrounded by the first device isolation layer pattern 150 and the first upper region 142 may protrude from a top surface of the first device isolation layer pattern 150.

Referring to FIG. 2B, similarly to the logic region 110, the memory region 120 may include a plurality of the fin active region patterns 140 and a plurality of the gate patterns 160. The plurality of fin active patterns 140 may extend in the second direction (Y direction) and have a line or bar shape. The plurality of gate patterns 160 may extend in the first direction (X direction) perpendicular to the second direction (Y direction). The plurality of fin active region patterns 140 may be arranged along the first direction (X direction) and the plurality of gate patterns 160 may be arranged along the second direction (Y direction). In another example, the fin active region patterns 140 may be spaced apart from each other along the second direction (Y direction) and the gate patterns 160 may be spaced apart from each other along the first direction (X direction).

The fin active region patterns 140 may be surrounded by a second device isolation layer pattern 152. Each of the fin active region patterns 140 in the memory region 120 may include a second upper region 143 that overlaps the gate pattern 160 and a second lower region 146 that is not overlapped with the gate pattern 160.

The second lower region 146 may be interposed between adjacent gate patterns 160. A top surface of the second upper region 143 may be higher than a top surface of the second lower region 146. For example, the second upper region 143 may be a region for forming a channel and the second lower region 146 may be a region for forming a second source/drain region 148 (refer to e.g., FIGS. 3A through 3C). The second source/drain region 148 may include a second stressor 148, i.e., the second source/drain region 148 may be the second stressor 148 to be used interchangeable hereinafter.

In an example embodiment, the second lower region 146 may be surrounded by the second device isolation layer pattern 152 and the second upper region 143 may protrude from a top surface of the second isolation layer pattern 152.

In an example embodiment, a first distance L1 between one fin active region pattern 140 constituting the first pull-up transistor PU1 and another fin active region pattern 140 constituting the second pull-up transistor PU2 may be less than a second distance L2 between other adjacent fin active region patterns 140. Accordingly, the first pull-up transistor PU1 and the second pull-up transistor PU2 may be positioned relatively close to each other, e.g., along the X direction, compared to other transistors.

Figure 3A:
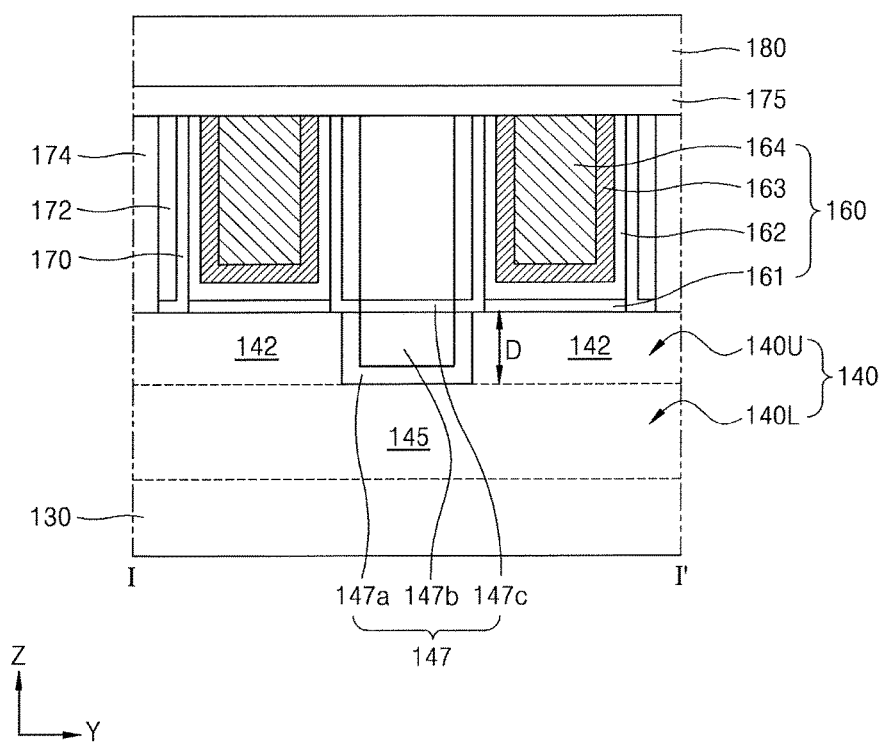
FIGS. 3A, 3B, and 3C illustrate views of a semiconductor device according to an example embodiment.
Figure 3B:
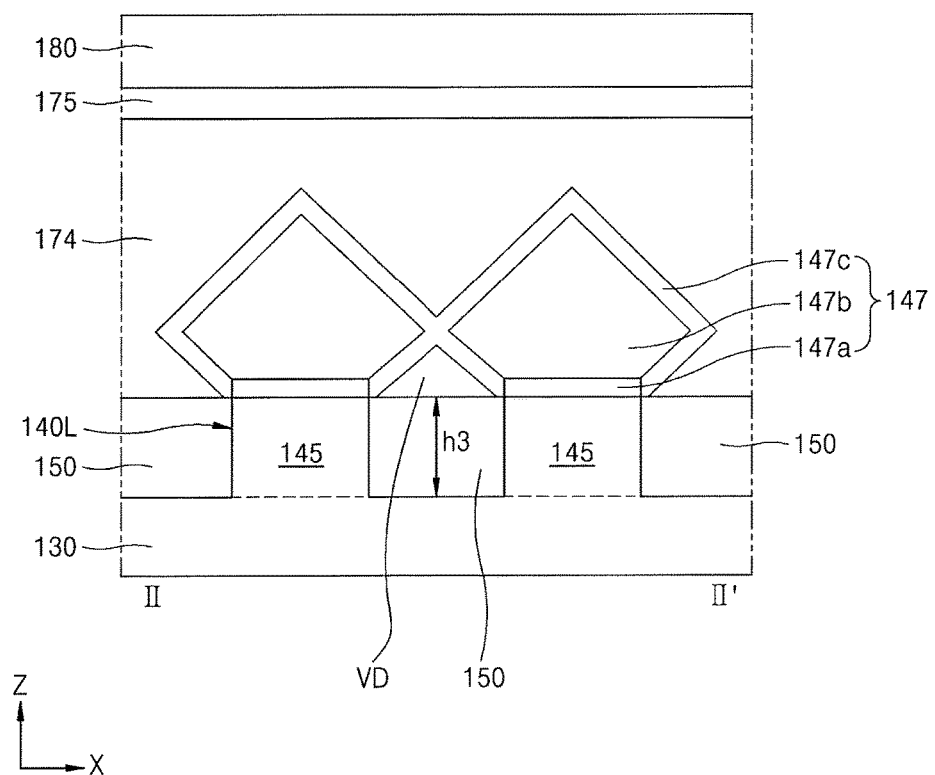
Figure 3C:
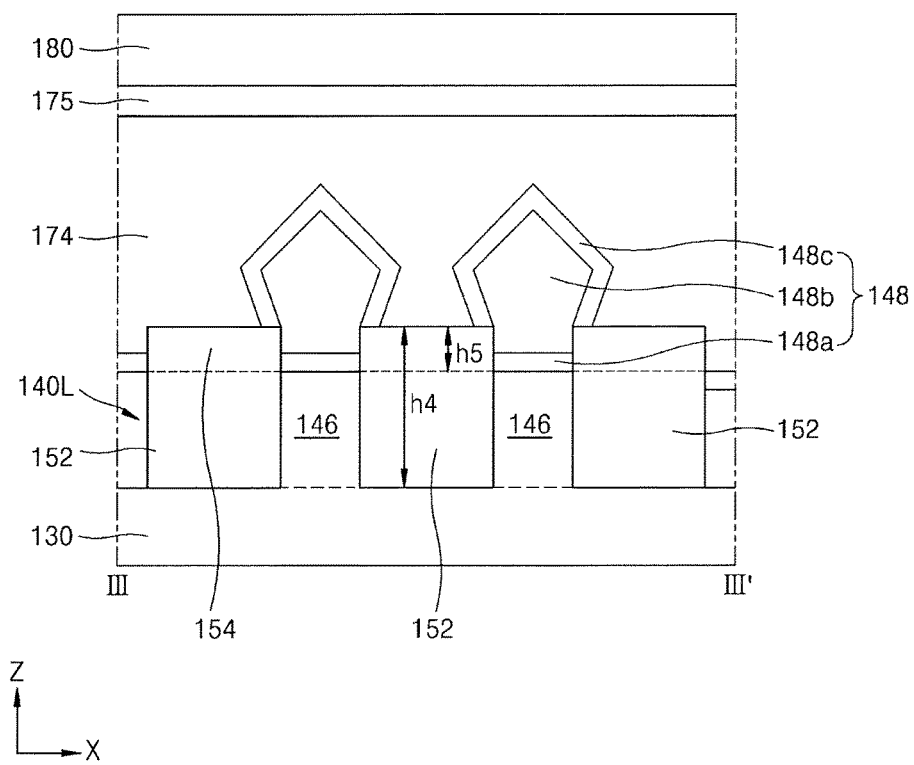

FIGS. 3A, 3B, and 3C are views of a semiconductor device according to an example embodiment. FIG. 3A is a cross-sectional view taken along line I-I' of FIG. 2A, FIG. 3B is a cross-sectional view taken along line II-II' of FIG. 2A, and FIG. 3C is a cross-sectional view taken along line III-III' of FIG. 2B.

Referring to FIGS. 3A, 3B, and 3C, the semiconductor device 100 according to an example embodiment may include the plurality of fin active region patterns 140 on the substrate 130, the first and second device isolation layer patterns 150 and 152 surrounding a side surface of each of the fin active region patterns 140, the gate patterns 160, an inner spacer 170, an outer spacer 172, a lower interlayer insulating layer 174, a stopper layer 175 and an upper interlayer insulating layer 180.

The substrate 130 may include a single crystal semiconductor substrate (e.g., a silicon wafer or a silicon-on-insulator (SOI) wafer).

The fin active region patterns 140 may protrude from the substrate 130. The fin active region patterns 140 may be parts of the substrate 130. For example, the fin active region patterns 140 may be materially in continuity with the substrate 130. Each of the fin active region patterns 140 may include a lower fin active region 140L surrounded by the first and second device isolation layer patterns 150 and 152, and an upper fin active region 140U protruding above the top surfaces of the first and second device isolation layer patterns 150 and 152. The upper fin active region 140U may include the first and second upper regions 142 and 143 and the lower fin active region 140L may include the first and second lower regions 145 and 146.

The gate patterns 160 may partially cover the top surfaces and sidewalls of the first and second upper regions 142 and 143, and may extend above the first and second device isolation layer pattern 150 and 152.

The first source/drain region 147 may be disposed in the logic region 110 and the second source/drain region 148 may be disposed in the memory region 120. The first source/drain region 147 may be positioned on the first lower region 145 between adjacent first upper regions 142. The second source/drain region 148 may be positioned on the second lower region 146 between adjacent upper regions 143.

Each of the first and second upper regions 142 and 143 may be positioned in the upper fin active region 140U covered with the gate pattern 160. Each of the first and second lower regions 145 and the 146 may be positioned in the lower fin active region 140L not covered with the gate pattern 160.

In an example embodiment, the first stressor 147 may be disposed on the first lower region 145, and the second stressor 148 may be disposed on the second lower region 146. Each of the first and second stressors 147 and 148 may include an epitaxial layer. For example, the first stressor 147 may include a first epitaxial layer 147a, a second epitaxial layer 147b, and a third epitaxial layer 147c sequentially stacked on the first lower region 145. In addition, the second stressor 148 may include a first epitaxial layer 148a, a second epitaxial layer 148b, and a third epitaxial layer 148c sequentially stacked on the second lower region 146.

In an example embodiment, each of the first through third epitaxial layers 147a, 147b, 147c, 148a, 148b and 148c may include an elevated SiGe layer. In this case, a silicon content of each of the first epitaxial layers 147a and 148a may be greater than a silicon content of each of the second epitaxial layers 147b and 148b, and may be less than a silicon content of each of the third epitaxial layers 147c and 148c. In another example, the first through third epitaxial layers 147a, 147b, 147c, 148a, 148b and 148c may include an elevated Si layer doped with impurities.

In an example embodiment, each of the first and second stressors 147 and 148 may vertically extend to a top surface of the lower fin active region 140L by a predetermined depth D from a top surface of the upper fin active region 140U between the first upper regions 142 or between the second upper regions 143. Bottom surfaces of the first and second stressors 147 and 148 may contact top surfaces of the first and second lower regions 145 and 146 (i.e., top surfaces of the lower fin active regions 140L), respectively. In this case, as shown in FIGS. 3A and 3B, the top surface of the first lower region 145 may be lower than the top surface of the first upper region 142, and may be disposed at substantially the same height as the top surface of the first device isolation layer pattern 150. As shown in FIG. 5B, the top surface of the second lower region 146 may be lower than the top surface of the second upper region 143. As shown in FIG. 3C, the top surface of the second lower region 146 may be lower than the top surface of the second device isolation layer pattern 152.

In an example embodiment, the first stressor 147 in the logic region 110 may be in contact with another adjacent stressor. A void VD may be disposed, e.g., defined, therebetween. The second stressor 148 in the memory region 120 may be spaced apart from another adjacent stressor by an insulating fence pattern 154 interposed therebetween and protruding from the second device isolation layer pattern 152. In other words, the first stressor 147 may be disposed on the first lower region 145 adjacent to the first device isolation layer pattern 150, and may contact another adjacent first stressor 147, and the second stressor 148 may be disposed on the second lower region 146 adjacent to the second device isolation layer pattern 152, and may be spaced apart from another adjacent second stressor 148 by the second device isolation layer pattern 152, e.g., and the insulating fence pattern 154, interposed therebetween.

In an example embodiment, respective bottom surfaces of the first and second stressors 147 and 148 may be lower than the top surface of the lower fin active region 140L. In this case, although not shown in the drawings, the top surface of the first lower region 145 may be lower than the top surface of the first device isolation layer pattern 150.

In an example embodiment, the fin active region pattern 140 including the second upper region 143 and the second lower region 146, the second stressor 148, and the gate pattern 160 may constitute a PMOS transistor of an SRAM memory device.

It is necessary to increase a volume of a stressor in order to improve electrical characteristics of a semiconductor device. The volume of the stressor may be proportional to the depth D of the stressor. Accordingly, increasing the depth D of the stressor improves electrical characteristics of the semiconductor device. However, when the volume of the stressor is increased, adjacent stressors may contact each other, thereby inducing an electrical short therebetween. For example, when the PMOS transistors of the SRAM memory device region are configured to be electrically separated from each other, and the respective stressors of the PMOS transistors are electrically in contact with each other, the electrical characteristics of the semiconductor device may be degraded.

Therefore, according to some example embodiments, as shown in FIG. 3C, even though, in order to improve the electrical characteristics of the semiconductor device, the depth D of each stressor of the logic region 110 and the memory region 120 increases, a lateral growth of the second stressor 148 of the memory region 120 may be suppressed by the insulating fence pattern 154. Accordingly, the electrical characteristics of the semiconductor device may be improved, while concurrently preventing an electrical short between the stressors. The insulating fence pattern 154 may be an upper portion of the second device isolation layer pattern 152. A height h4 of the second device isolation layer pattern 152 in the memory region 120 (FIG. 3C) may be greater than a height h3 of the first device isolation layer pattern 150 (FIG. 3B) by a height h5 of the insulating fence pattern 154. In other words, the height h4 of the second device isolation layer pattern 152 may equal the sum of the height h3 of the first device isolation layer pattern 150 and the height h5 of the insulating fence pattern 154, e.g., as measured from a top of the substrate 130 along a normal to the top of the substrate.

According to some example embodiments, because each of the first and second stressors 147 and 148 includes single crystal SiGe having a lattice constant greater than that of the substrate 130, the first and second stressors 147 and 148 may apply compressive strains to channel regions of the first and second upper regions 142 and 143, respectively. Accordingly, hole mobility of the channel regions may increase. As a result, it is possible to improve a performance of the semiconductor device.

The gate pattern 160 may include a surface insulation layer pattern 161, a gate insulation layer pattern 162, a gate barrier layer pattern 163, and a gate electrode pattern 164 sequentially stacked on the upper region 142 (or 143) of the upper fin active region 140U.

In an example embodiment, the surface insulation layer pattern 161 may include, e.g., silicon oxide. In another example, the surface insulation layer pattern 161 may be omitted.

The gate insulation layer pattern 162 may have a U-shaped cross-section on the surface insulation layer pattern 161. For example, an outer side surface of the gate insulation layer pattern 162 may be in contact with an inner side surface of the inner spacer 170. The gate insulation layer pattern 162 may include, e.g., a high-k dielectric insulation material (e.g., hafnium oxide (HfO), aluminum oxide (AlO), zirconium oxide (ZrO), lanthanum oxide (LaO), or another metal oxide).

The gate barrier layer pattern 163 may have a U-shaped cross-section on the gate insulation layer pattern 162. For example, an outer side surface of the gate barrier layer pattern 163 may be in contact with an inner side surface of the gate insulation layer pattern 162. The gate barrier layer pattern 163 may include, e.g., titanium (Ti), titanium nitride (TiN), tantalum (Ta), tantalum nitride (TaN), titanium tungsten (TiW), or a combination thereof.

Sidewalls and a bottom surface of the gate electrode pattern 164 may be surrounded by the gate barrier layer pattern 163. The gate electrode pattern 164 may include a metal having a high conductivity (e.g., tungsten or copper). Respective top surfaces of the gate insulation layer pattern 162, the gate barrier layer pattern 163, and the gate electrode pattern 164 may be substantially coplanar with each other.

The inner spacer 170 may be formed on both sidewalls of the gate pattern 160. For example, the inner spacer 170 may be in contact with sidewalls of the surface insulation layer pattern 161, outer side surfaces of the gate insulation layer pattern 162, and top surfaces of the first and second upper regions 142 and 143. The inner spacer 170 may include, e.g., silicon oxide (SiO), silicon nitride (SiN), silicon oxynitride (SiON), or silicon oxycarbonitride (SiCON). For example, the inner spacer 170 may include, e.g., silicon nitride (SiN).

The outer spacer 172 may be formed on outer side surfaces of the inner spacer 170. The outer spacer 172 may include silicon oxide (SiO), silicon nitride (SiN), silicon oxynitride (SiON), or silicon oxycarbonitride (SiCON). For example, the outer spacer 172 may include silicon oxycarbonitride (SiCON). The outer spacer 172 may include an insulation material having a dielectric constant lower than that of the inner spacer 170.

The lower interlayer insulating layer 174 may cover the first and second source/drain regions 147 and 148 and may contact sidewalls of the gate patterns 160. Respective top surfaces of the lower interlayer insulating layer 174, the gate patterns 160, the inner spacer 170, and the outer spacer 172 may be substantially coplanar with each other. The lower interlayer insulating layer 174 may include, e.g., silicon oxide (SiO).

The upper interlayer insulating layer 180 may cover the lower interlayer insulating layer 174, the gate patterns 160, the inner spacer 170, and the outer spacer 172. The upper interlayer insulating layer 180 may include, e.g., silicon oxide (SiO).

The semiconductor 100 may further include a stopper layer 175 that is disposed between the lower interlayer insulating layer 174 and the upper interlayer insulating layer 180. The stopper layer 175 may include, e.g., silicon nitride (SiN).

Figure 4A:
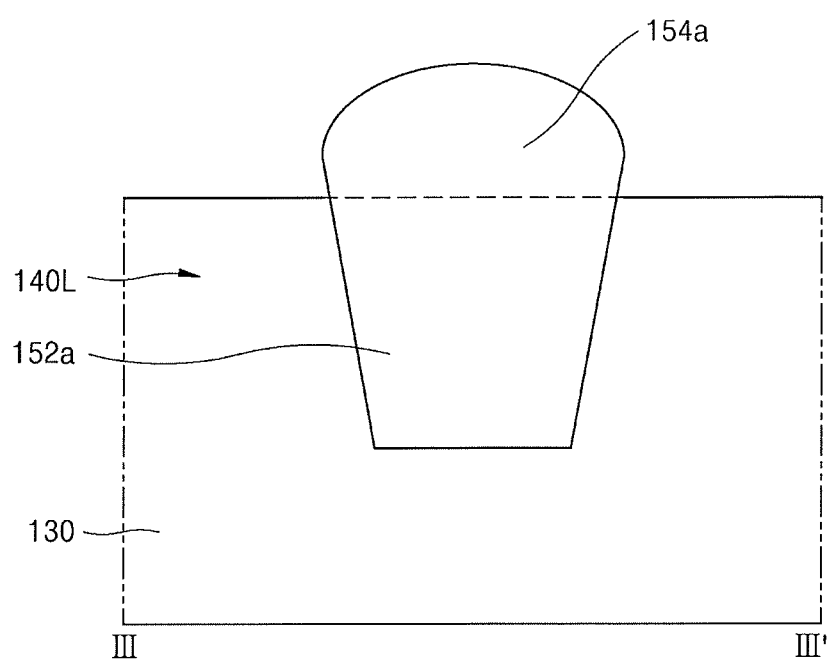
FIGS. 4A and 4B illustrate cross-sectional views of a semiconductor device according to an example embodiment.
Figure 4B:
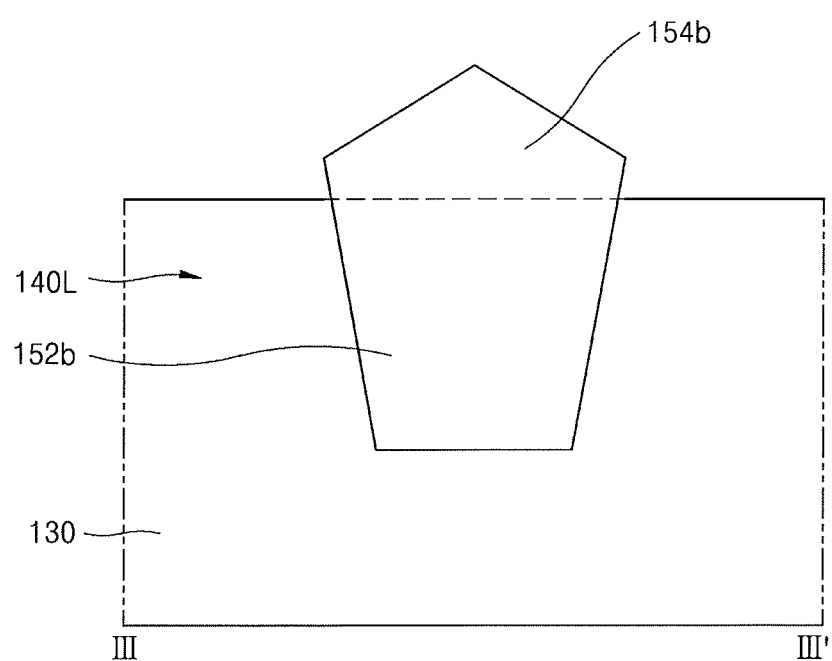

FIGS. 4A and 4B are cross-sectional views illustrating essential parts of FIG. 3C according to another example embodiment.

For example, referring to FIG. 4A, a top surface of an insulating fence pattern 154*a* of a device isolation layer pattern 152*a* may be a convex curved surface shape. In another example, referring to FIG. 4B, a top surface of an insulating fence pattern 154*b* of a device isolation layer pattern 152*b* may be a convex polygonal shape.

Figure 5A:
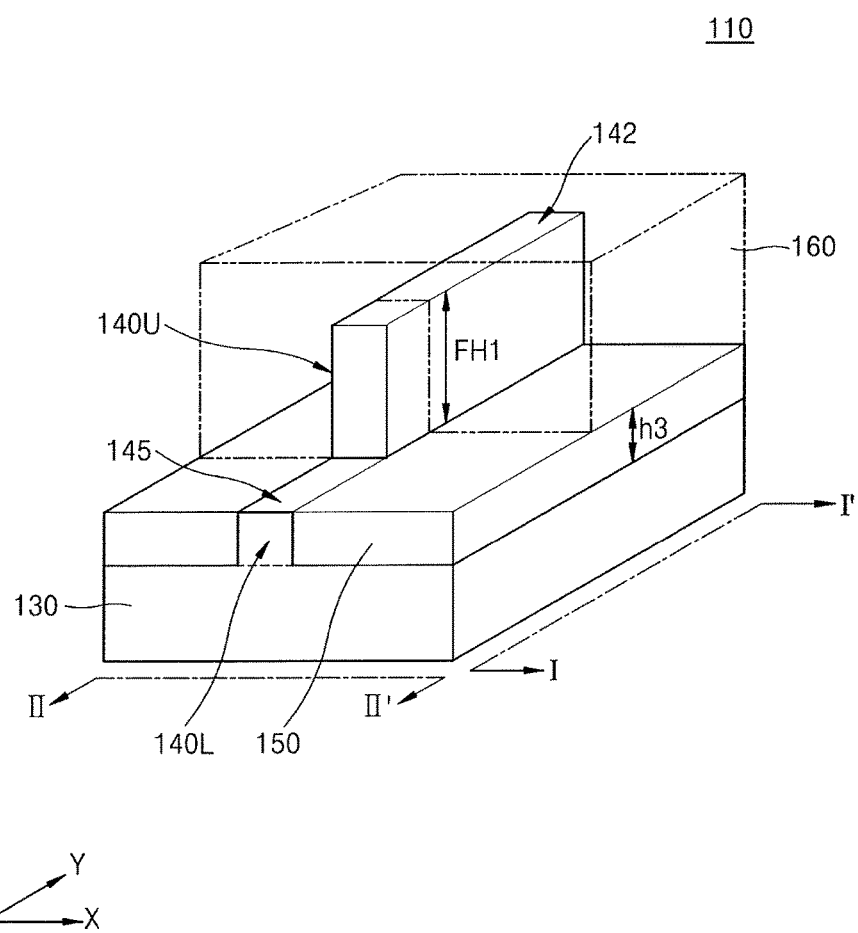
FIG. 5A illustrates a perspective view of FIGS. 2A, 3A and 3B.
Figure 5B:
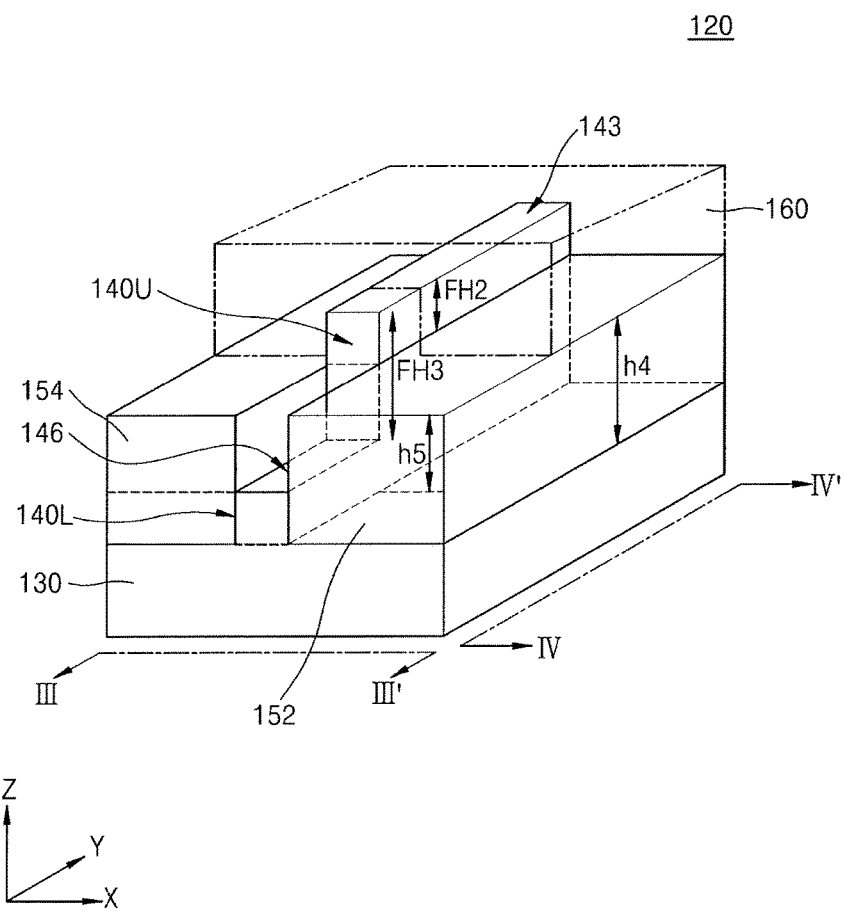
FIG. 5B illustrates a perspective view of FIGS. 2B and 3C.

FIG. 5A is a perspective view illustrating essential parts of the logic region 110 taken along the lines I-I' and II-II' of FIG. 2A, and FIG. 5B is a perspective view illustrating essential parts of the memory region 120 taken along the lines III-III' and IV-IV' of FIG. 2B. For convenience of explanation, some elements of FIGS. 5A and 5B are omitted.

Referring to FIG. 5A, the top surface of the first device isolation layer pattern 150 may be lower than the top surface of the first upper region 142. The top surface of the first device isolation layer pattern 150 may be disposed at substantially the same height as or higher than the top surface of the first lower region 145. The top surface of the first device isolation layer pattern 150 adjacent to the first upper region 142 may be substantially coplanar with the top surface of the first device isolation layer pattern 150 adjacent to the first lower region 145. The top surface of the first upper region 142 may be higher than the top surface of the first lower region 145. The top surface of the first stressor 147 that is formed on the first lower region 145 may be higher than the top surface of the first device isolation layer pattern 150.

Referring to FIG. 5B, the top surface of the second device isolation layer pattern 152 may be lower than the top surface of the second upper region 143. The top surface of the second device isolation layer pattern 152 may be higher than the top surface of the second lower region 146. The top surface of the second device isolation layer pattern 152 adjacent to the second upper region 143 may be disposed at substantially the same height as the top surface of the second device isolation layer pattern 152 adjacent to the second lower region 146. The top surface of the second upper region 143 may be higher than the top surface of the second lower region 146. The top surface of the second stressor 148 that is formed on the second lower region 146 may be higher than the top surface of the second device isolation layer pattern 152.

Further referring to FIGS. 5A-5B, in an example embodiment, a fin height FH1 of the first upper region 142 protruding above the top surface of the first device isolation layer pattern 150 may be greater than a fin height FH2 of the second upper region 143 protruding above the top surface of the second device isolation layer pattern 152. The fin height FH1 of the first upper region 142 may be a distance ranging, e.g., extending, from the top surface of the first upper region 142 to the top surface of the first device isolation layer pattern 150. The fin height FH2 of the second upper region 143 may be a distance ranging, e.g., extending, from the top surface of the second upper region 143 to the top surface of the second device isolation layer pattern 152. The height h4 of the second device isolation layer pattern 152 may be greater than the height h3 of the first device isolation layer pattern 150. For example, the height h4 of the second device isolation layer pattern 152 may be greater than the height h3 of the first device isolation layer pattern 150 by the height h5 of the insulting fence pattern 154.

In an example embodiment, a fin height FH3 of the second upper region 143, i.e., a height of the second upper region 143 relative to the top surface of the second lower region 146, may substantially equal to the fin height FH1 of the first upper region 142 protruding above the top surface of the first device isolation layer pattern 150.

In an example embodiment, the top surface of the first upper region 142 in the logic region 110 may be disposed at substantially the same height as the top surface of the second upper region 143 in the memory region 120. In an example embodiment, the top surface of the first lower region 145 may be disposed at substantially the same height as the top surface of the second lower region 146.

FIGS. 6A through 15A, FIGS. 6B through 15B, and FIGS. 6C through 15C are views illustrating stages of a method of manufacturing a semiconductor device of FIGS. 1, 2A, 2B, 2C, 3A, 3B, 3C, 4A, 4B, 5A, and/or 5B. FIGS. 6A through 15A are cross-sectional views corresponding to a cross-section taken along the line I-I' of FIG. 2A, FIGS. 6B through 15B are cross-sectional views corresponding to a cross-section taken along the line II-II' of FIG. 2A, and FIGS. 6C through 15C are cross-sectional views corresponding to a cross-section taken along the line III-III' of FIG. 2B.

Figure 6A:
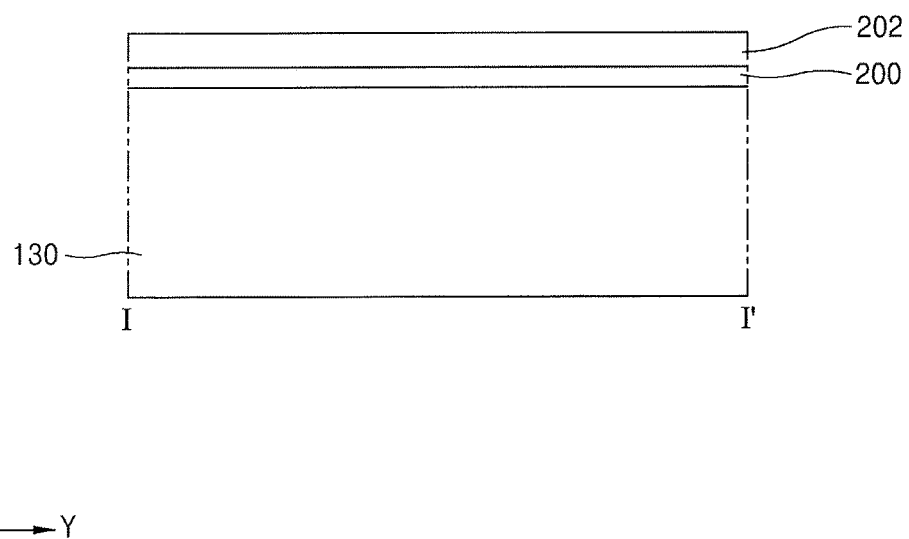
Figure 6B:
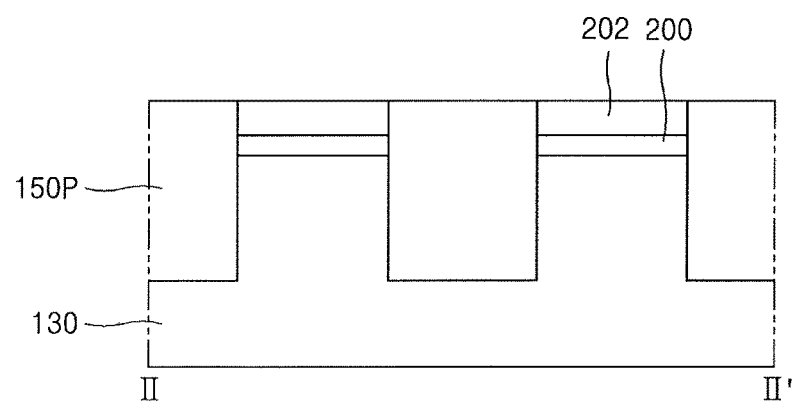
Figure 6C:
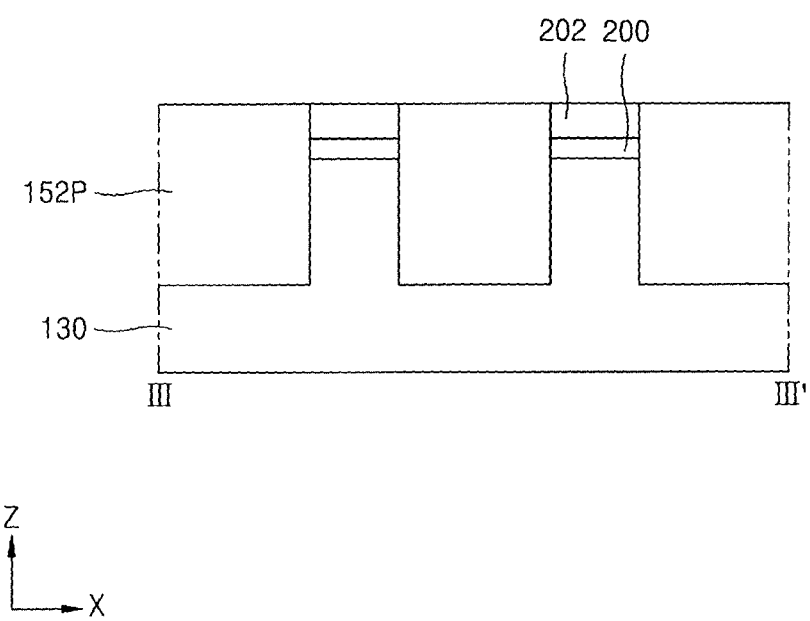

Referring to FIGS. 6A through 6C, a method of manufacturing the semiconductor device 100 according to an example embodiment may include sequentially forming a pad oxide layer 200 and a hard mask layer 202 on the substrate 130. The substrate 130 may include the logic region 110 and the memory region 120.

A first preliminary device isolation layer pattern 150P and a second preliminary device isolation layer pattern 152P may be formed in the logic region 110 and the memory region 120, respectively, by partially etching the hard mask layer 202, the pad oxide layer 200, and the substrate 130, and filling therein with an insulating layer. The pad oxide layer 200 may include, e.g., a silicon oxide layer, and the hard mask layer 202 may include, e.g., a silicon nitride layer.

Figure 7A:
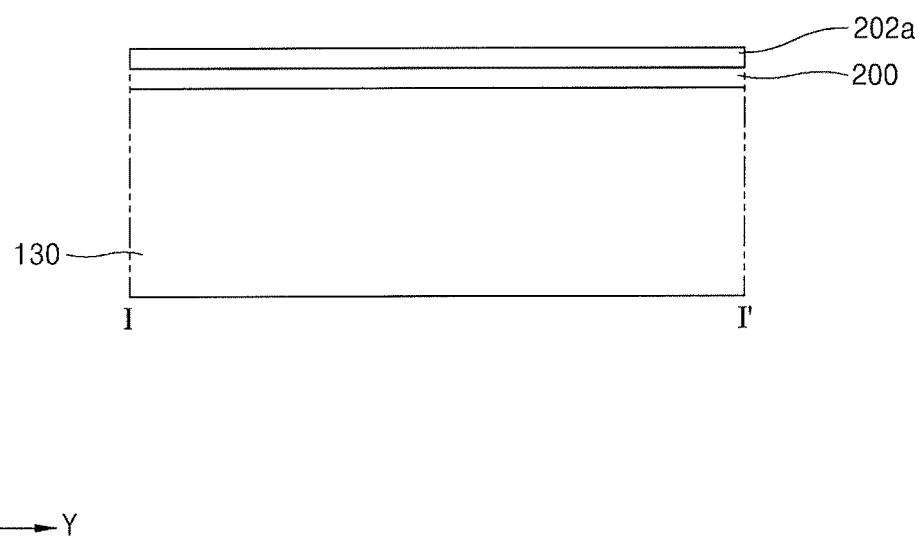
Figure 7B:
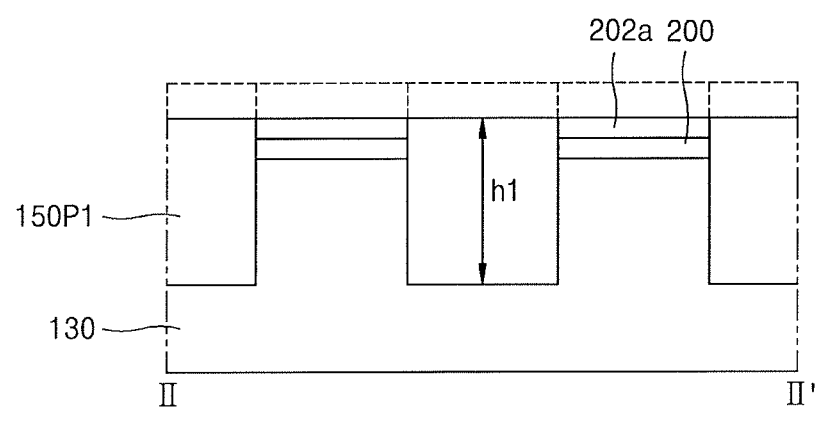
Figure 7B:
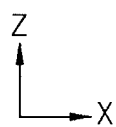
Figure 7C:
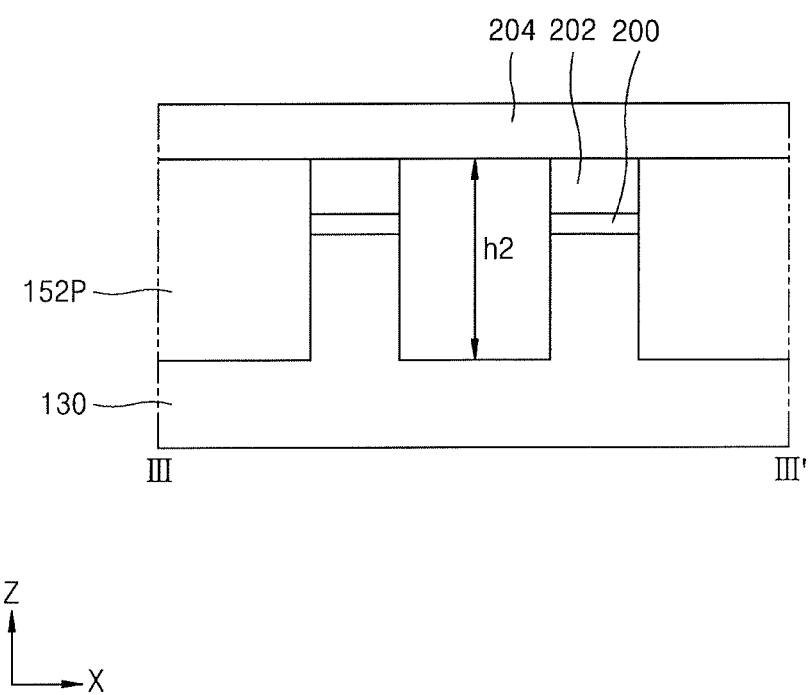

Referring to FIGS. 7A through 7C, a mask layer pattern 204 may be selectively formed in the memory region 120. Through a deglaze process, respective upper portions of the hard mask layer 202 and the first preliminary device isolation layer pattern 150P in the logic region 110 may be selectively removed. As a result, a third preliminary device isolation layer pattern 150P1 may be formed in the logic region 110 (FIG. 7B). A height h1 of the third preliminary device isolation layer pattern 150P1 in the logic region 110 may be lower than a height h2 of the second preliminary device isolation layer pattern 152P in the memory region 120 (FIG. 7C).

The deglaze process may be performed using gases including, e.g., carbon tetrafluoride ($CF_4$), octafluorocyclobutane ($C_4F_8$) and oxygen (O2). The deglaze process may be a dry etching process.

In an example embodiment, at least half the total thickness of the hard mask layer 202 in the logic region 110 may be removed. Accordingly, a remaining hard mask layer 202a may be formed on the pad oxide layer 200 in the logic region 110. A top surface of the remaining hard mask layer 202a may be substantially coplanar with a top surface of the third preliminary device isolation layer pattern 150P1.

In an example embodiment, the deglaze process may be replaced by a wet etching process.

Figure 8A:
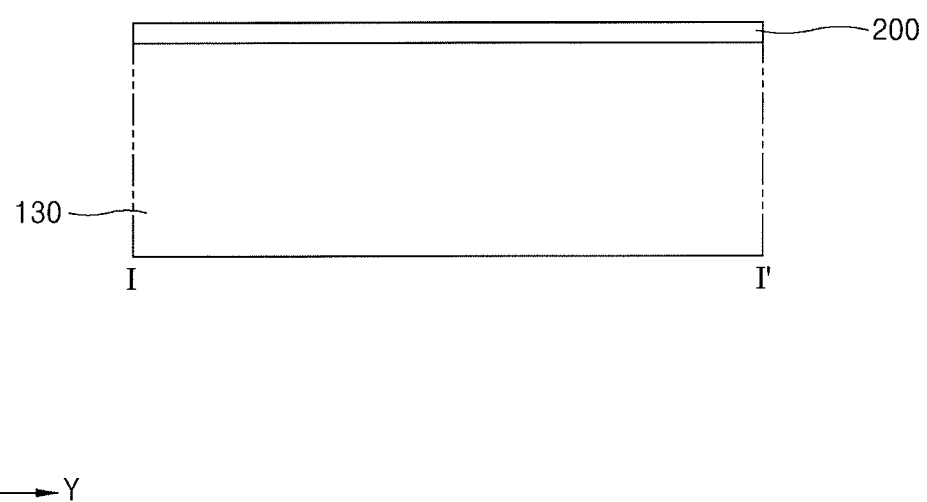
Figure 8B:
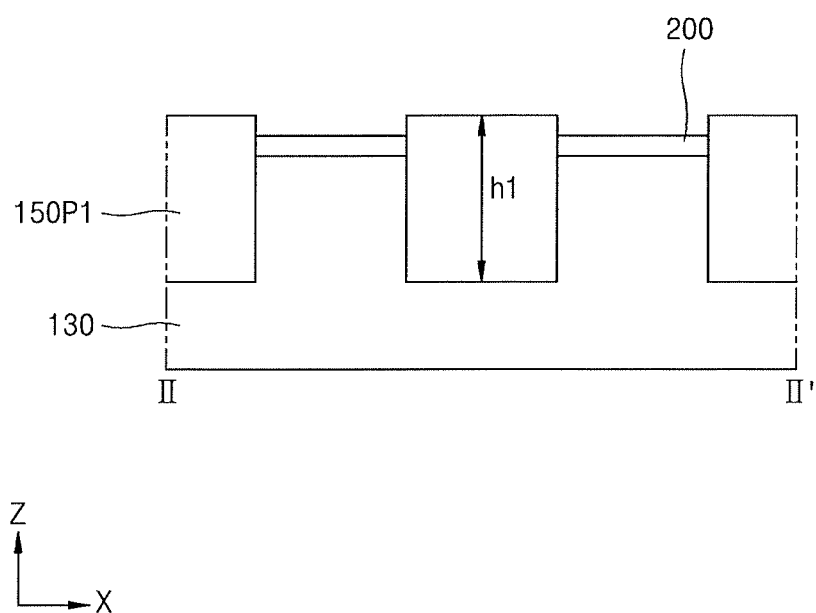
Figure 8C:
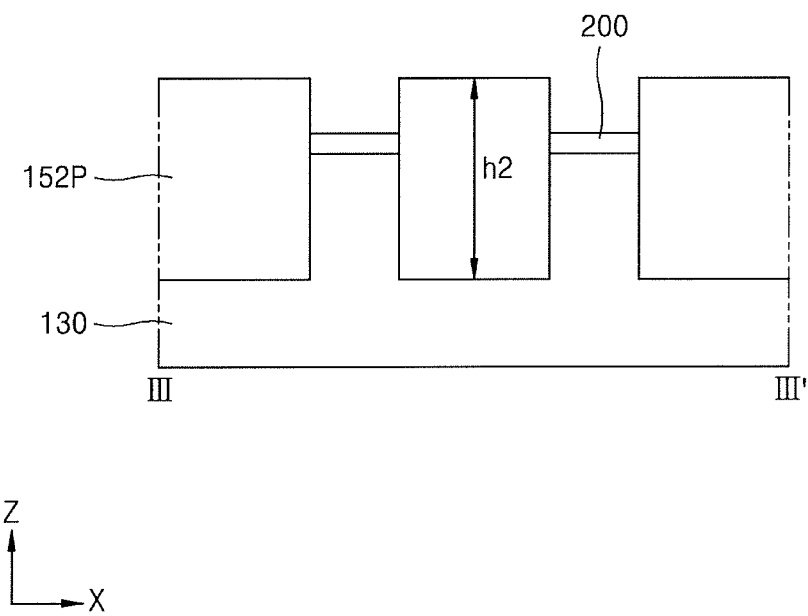

Referring to FIGS. 8A through 8C, after removing the mask layer 204 in the memory region 120, the remaining hard mask layer 202a in the logic region 110 and the hard mask layer 202 in the memory region 120 may be removed using a wet etching process. As a result, a top surface of the pad oxide layer 200 may be exposed. Furthermore, respective top surfaces and sidewalls of the third preliminary device isolation layer pattern 150P1 and the second preliminary device isolation layer pattern 152P may be exposed.

Figure 9A:
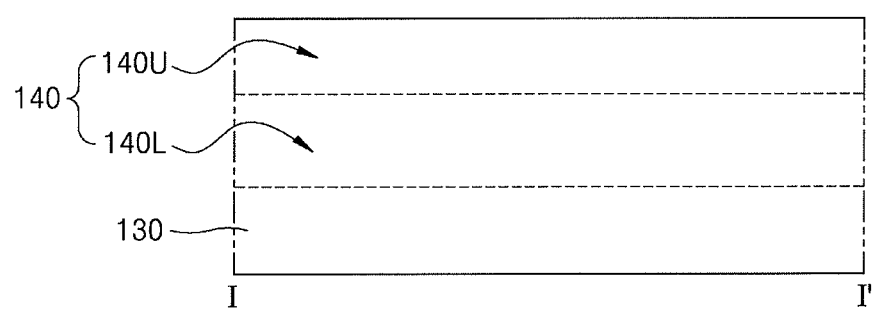
Figure 9A:
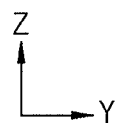
Figure 9B:
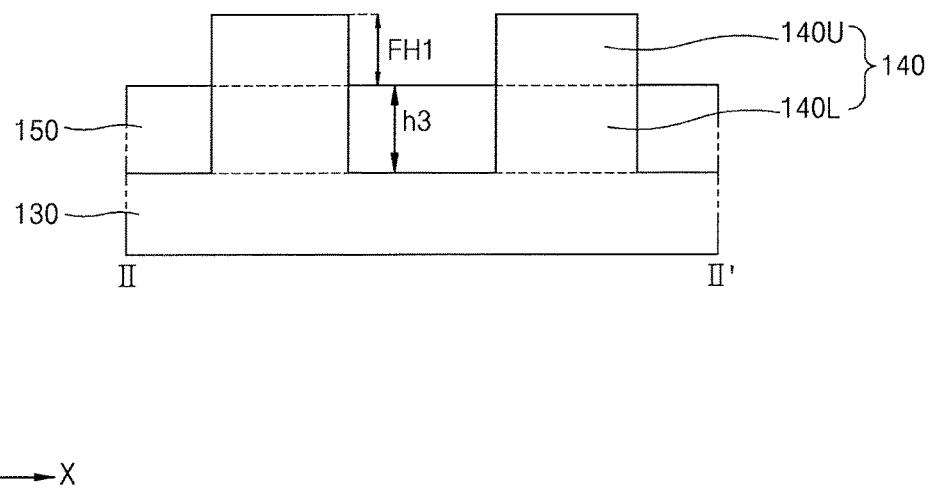
Figure 9C:
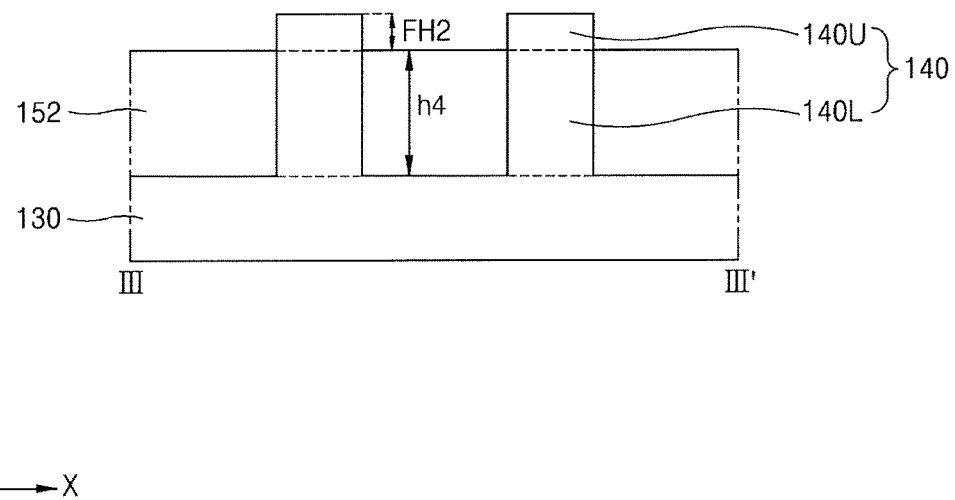

Referring to FIGS. 9A through 9C, the pad oxide layer 200 and respective upper portions of the third preliminary device isolation layer pattern 150P1 and the second preliminary device isolation layer pattern 152P may be removed through a wet etching process or a dry/wet etching process. The pad oxide layer 200 may be completely removed. Respective upper portions of the third preliminary device isolation layer pattern 150P1 and the second preliminary device isolation layer pattern 152P may be removed by a substantially same thickness. Accordingly, a first device isolation layer pattern 150 may be formed in the logic region 110 and a second device isolation layer pattern 152 may be formed in the memory region 120. The fin active region pattern 140 in the logic region 110 may include the lower fin active region 140L surrounded by the first device isolation layer pattern 150 and the upper fin active region 140U protruding from the lower fin active region 140L above the top surface of the first device isolation region 150. The fin active region pattern 140 in the memory region 120 may include the lower fin active region 140L surrounded by the second device isolation layer pattern 152 and the upper fin active region 140U protruding above the top surface of the second device isolation layer pattern 152.

In an example embodiment, a height h3 of the first device isolation layer pattern 150 in the logic region 110 may be less than a height h4 of the second device isolation layer pattern 152. A top surface of the fin active region pattern 140 in the logic region 110 may be substantially coplanar with a top surface of the fin active region pattern 140 in the memory region 120. Accordingly, a fin height FH1 of the upper fin active region 140U protruding above the top surface of the first device isolation layer pattern 150 in the logic region 110 may be greater than a fin height FH2 of the upper fin active region 140U protruding above the top surface of the second device isolation layer pattern 152 in the memory region 120.

Figure 10A:
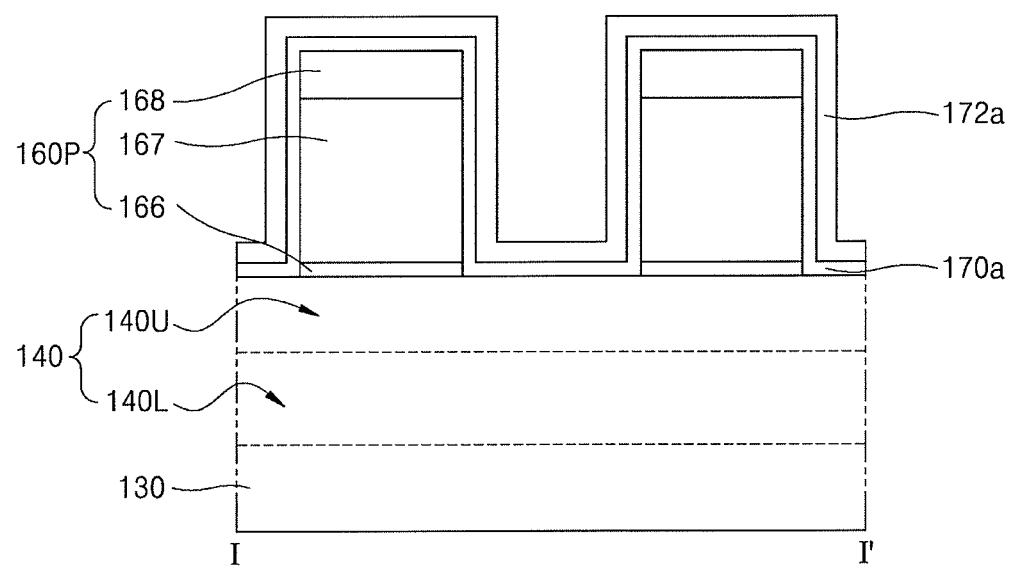
Figure 10A:
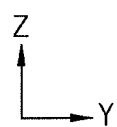
Figure 10B:
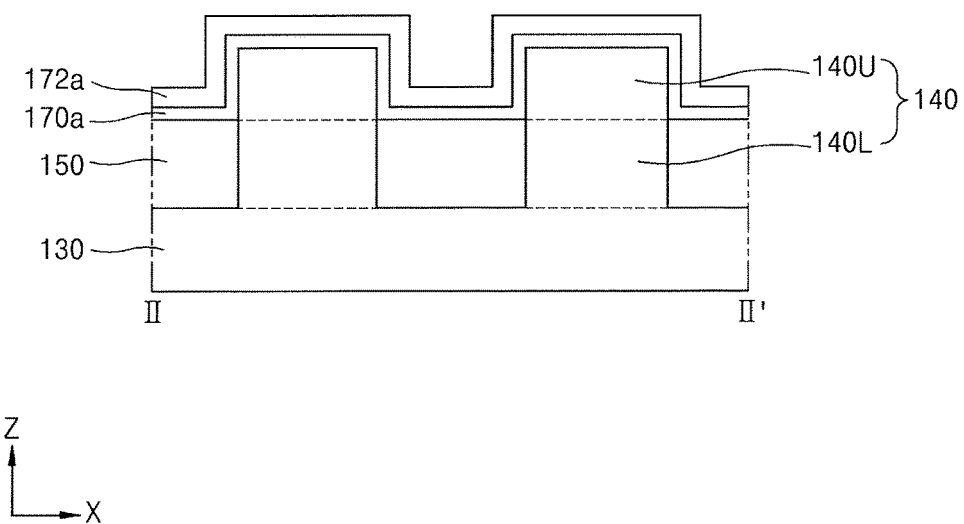
Figure 10C:
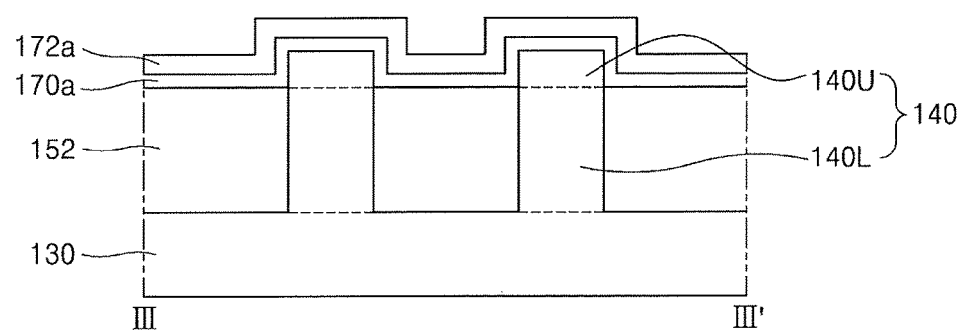
Figure 10C:
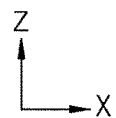

Referring to FIGS. 10A through 10C, a plurality of gate patterns may be formed on some areas of the upper fin active region 140U in the logic region 110 and the first device isolation layer pattern 150. In addition, a plurality of gate patterns may be formed on some areas of the upper fin active region 140U in the memory region 120 and the second device isolation layer pattern 152. The gate patterns may be in contact with top surfaces and sidewalls of the respective upper fin active regions 140U in the logic region 110 and the memory region 120. The gate patterns in the logic region 110 and the memory region 120 may be final gate patterns.

In an example embodiment, the gate patterns in the logic region 110 and the memory region 120 may be preliminary gate patterns 160P. The preliminary gate patterns 160P may be formed on some areas of the respective fin active region patterns 140 in the logic region 110 and the memory region 120 and some areas of the first and second device isolation layer patterns 150 and 152. Each of the preliminary gate patterns 160P may include a sacrificial gate insulation layer pattern 166, a sacrificial gate electrode pattern 167, and a sacrificial gate capping pattern 168. The sacrificial gate insulation layer pattern 166 may include a thermally oxidized silicon oxide or a silicon oxide deposited through an atomic layer deposition (ALD) process. The sacrificial gate electrode pattern 167 may include, e.g., polycrystalline silicon. The sacrificial gate capping pattern 168 may include, e.g., silicon nitride.

An inner spacer material layer 170a and an outer spacer material layer 172a may be sequentially formed on the substrate 130 including the preliminary gate patterns 160P. The inner spacer material layer 170a may include, e.g., silicon oxide (SiO), silicon nitride (SiN), silicon oxynitride (SiON) or silicon oxycarbonitride (SiOCN). For example, the inner spacer material layer 170a may include silicon nitride (SiN). The inner spacer material layer 170a may be formed by performing an atomic layer deposition (ALD) process. The outer spacer material layer 172a may include, e.g., silicon oxide (SiO), silicon nitride (SiN), silicon oxynitride (SiON), and silicon oxycarbonitride (SiOCN). For example, the outer spacer material layer 172a may include silicon oxycarbonitride (SiOCN). The outer spacer material layer 172a may have a dielectric constant lower than that of the inner spacer material layer 170a. The outer spacer material layer 172a may be formed by performing an atomic layer deposition (ALD) process.

The inner spacer material layer 170a may be in contact with respective top surfaces and sidewalls of the preliminary gate patterns 160P in the logic region 110 and the memory region 120. The inner spacer material layer 170a may be in contact with respective top surfaces of the first and second device isolation layer patterns 150 and 152 in the logic region 150 and the memory region 120. In addition, the inner spacer material layer 170a may be in contact with respective top surface and sidewalls of the upper fin active regions 140U in the logic region 110 and the memory region 120. The outer spacer material layer 172a may be conformally formed on the inner spacer material layer 170a.

Figure 11A:
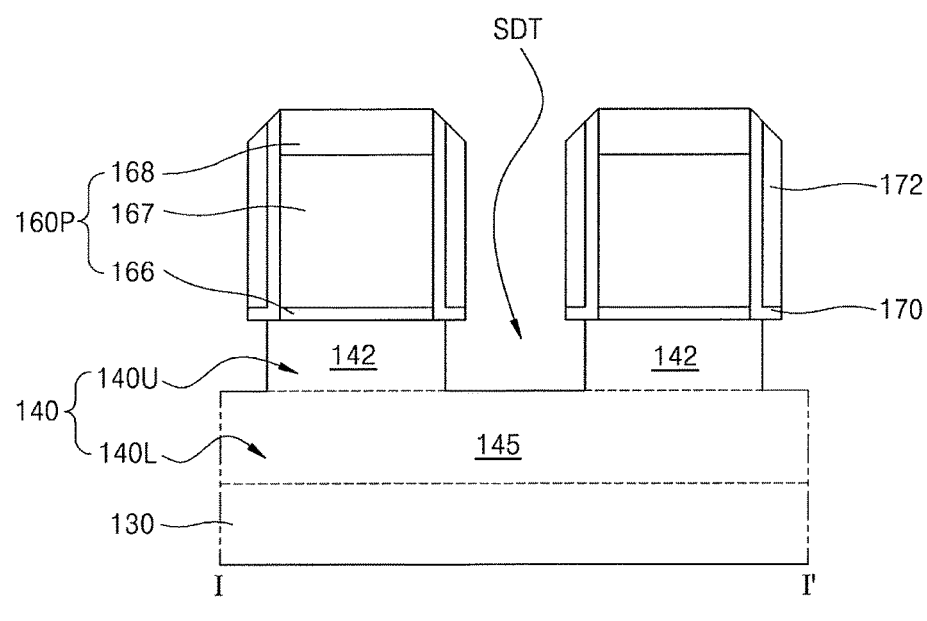
Figure 11A:
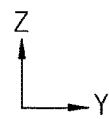
Figure 11B:
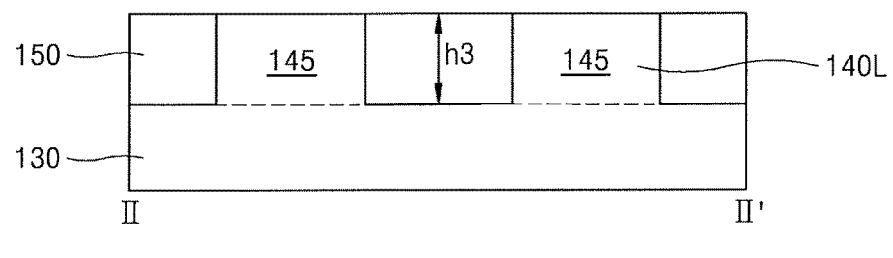
Figure 11C:
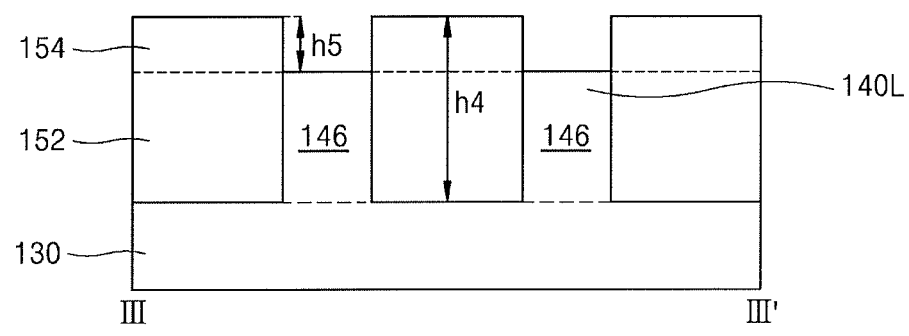

Referring to FIGS. 11A through 11C, source/drain trenches SDT may be formed in the logic region 110 and the memory region 120. The source/drain trenches SDT may be formed by selectively etching the upper fin active regions 140U between the preliminary gate patterns 160P using the preliminary gate patterns 160P as etch masks. The source/drain trenches SDT may be formed through a dry etching process. In the etching process, the inner spacer material layer 170a and the outer spacer material layer 172a may be partially removed and an inner spacer 170 and an outer spacer 172 may be formed on sidewalls of the preliminary gate patterns 160P.

The upper fin active regions 140U in the logic region 110 and the memory region 120 may be simultaneously etched by a substantially same amount. In an example embodiment, in the logic region 110 and the memory region 120, respective bottom surfaces of the source/drain trenches SDT may be formed to be substantially coplanar with respective top surfaces of the lower fin active regions 140L. In this case, the bottom surface of the source/drain trench SDT of the fin active region pattern 140 in the logic region 110 may be substantially coplanar with the top surface of the first device isolation layer pattern 150. Furthermore, the bottom surface of the source/drain trench SDT of the fin active region pattern 140 in the memory region 120 may be lower than the top surface of the second device isolation layer pattern 152.

In an example embodiment, in the logic region 110 and the memory region 120, respective bottom surfaces of the source/drain trenches SDT may be formed lower than respective top surfaces of the lower fin active regions 140L. In this case, the bottom surface of the source/drain trench SDT of the fin active region pattern 140 in the logic region 110 may be lower than the top surface of the first device isolation layer pattern 150. Furthermore, the bottom surface of the source/drain trench SDT of the fin active region pattern 140 in the memory region 120 may be lower than the top surface of the second device isolation layer pattern 152.

Through the formation process of the source/drain trench SDT, the fin active region pattern 140 in the logic region 110 may be divided into a first upper region 142 and a first lower region 145. In addition, the fin active region pattern 140 in the memory region 120 may be divided into a first upper region 143 (see FIG. 2B) and a second lower region 146. The bottom surface of the source/drain trench SDT in the logic region 110 may correspond to a top surface of the first lower region 145. The bottom surface of the source/drain trench SDT in the memory region 120 may correspond to a top surface of the second lower region 146.

The first lower region 145 may be surrounded by the first device isolation layer pattern 150, and the first upper region 142 may protrude above the top surface of the first device isolation layer pattern 150. The second lower region 146 may be surrounded by the second device isolation layer pattern 152, and the second upper region 143 may protrude above the top surface of the second device isolation layer pattern 152.

In an example embodiment, a fin height of the first upper region 142 protruding above the top surface of the first device isolation layer pattern 150 may be greater than a fin height of the second upper region 143 protruding above the top surface of the second device isolation layer pattern 152. The fin height of the first upper region 142 may be a distance ranging, e.g., extending, from the top surface of the first upper region 142 to the top surface of the first device isolation layer pattern 150, and the fin height of the second upper region 143 may be a distance ranging, e.g., extending, from the top surface of the second upper region 143 to the top surface of the second device isolation layer pattern 152.

In an example embodiment, a top surface of the first upper region 142 may be higher than the top surface of the first lower region 145. In other words, the top surface of the fin active region pattern 140 in the logic region 110 may be higher than the bottom surface of the source/drain trench SDT in the logic region 110.

In an example embodiment, a top surface of the second upper region 143 may be higher than the top surface of the second lower region 146. In other words, the top surface of the fin active region pattern 140 in the memory region 120 may be higher than the bottom surface of the source/drain trench SDT in the memory region 120.

The top surface of the fin active region pattern 140 in the logic region 110 may be coplanar with the top surface of the fin active region pattern 140 in the memory region 120 and the bottom surface of the source/drain trench SDT in the logic region 110 may be coplanar with the bottom surface of the source/drain trench SDT in the memory region 120.

The second device isolation layer pattern 152 in the memory region 120 may include an insulating fence pattern 154. The insulating fence pattern 154 may have the height h5. Accordingly, the bottom surface of the source/drain trench SDT in the memory region 120 or the top surface of the second lower region 146 may be lower than the top surface of the second device isolation layer pattern 152 by the height h5. The top surfaces of the first and second lower regions 145 and 146 may be coplanar. The height h4 of the second device isolation layer pattern 152 may be greater than the height h3 of the first device isolation layer pattern 150 by the height h5. In addition, the top surface of the first upper region 142 in the logic region 110 may be substantially coplanar with the top surface of the second upper region 143 in the memory region 120.

In an example embodiment, the top surface of the first device isolation layer pattern 150 may be lower than the top surface of the fin active region pattern 140 in the logic region 110 and may be coplanar with or higher than the bottom surface of the source/drain trench SDT in the logic region 110. In addition, the top surface of the second device isolation layer pattern 152 may be lower than the top surface of the fin active region pattern 140 in the memory region 120 and may be higher than the bottom surface of the source/drain trench SDT in the memory region 120. In this case, the top surface of the first device isolation layer pattern 150 may be lower than the top surface of the second device isolation layer pattern 152.

Figure 12A:
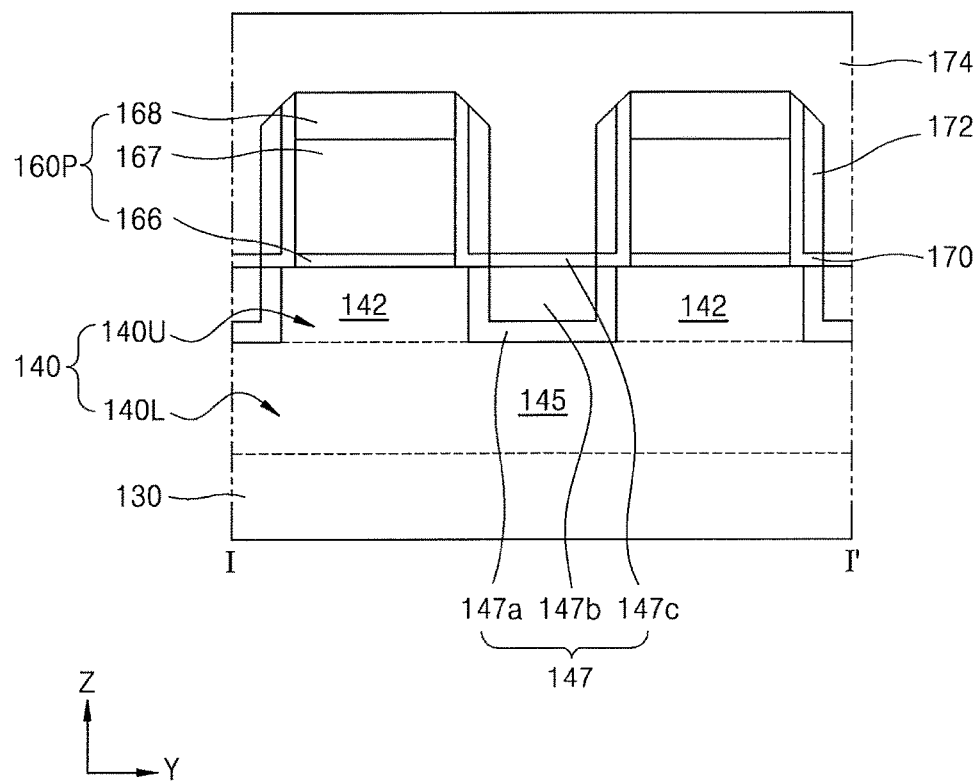
Figure 12B:
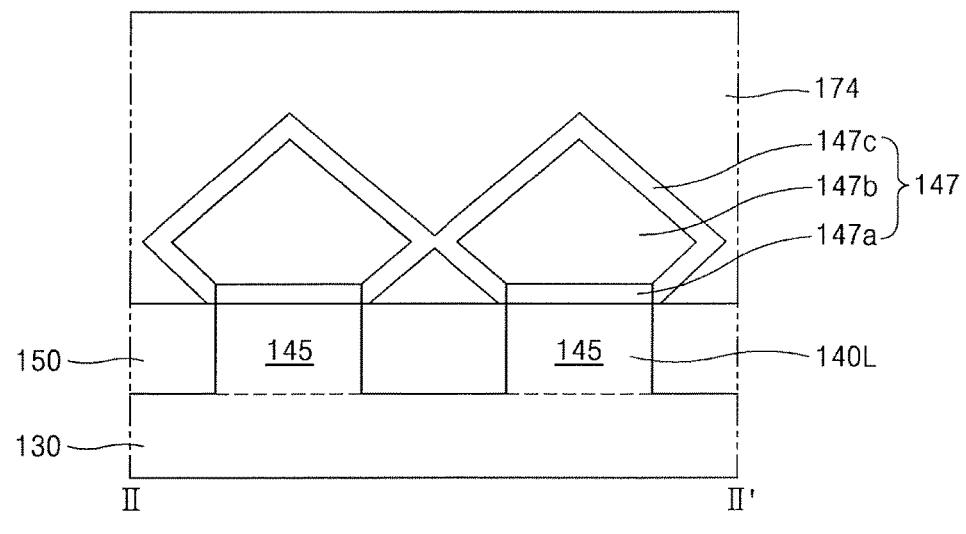
Figure 12C:
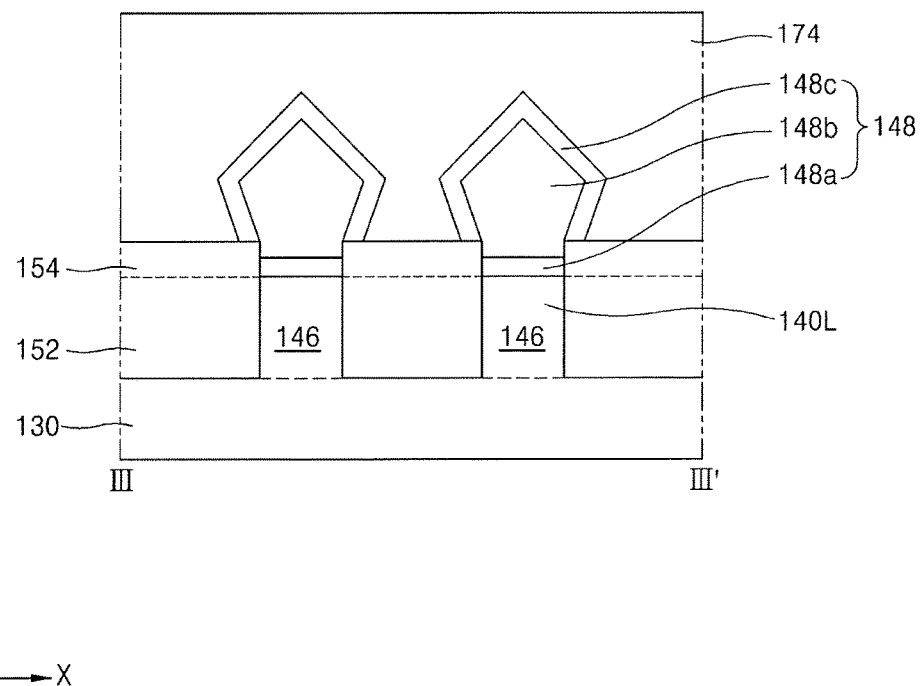

Referring to FIGS. 12A through 12C, the first stressor 147 may be conformally formed on the bottom surface and inner sidewalls of the source/drain trench SDT in the logic region 110 through a selective epitaxial growth (SEG) process. The first stressor 147 may include the first epitaxial layer 147a, the second epitaxial layer 147b, and the third epitaxial layer 147c sequentially formed on the first lower region 145. In addition, the second stressor 148 may be conformally formed on the bottom surface and inner sidewalls of the source/drain trench SDT in the memory region 120 through a selective epitaxial growth (SEG) process. The second stressor 148 may include the first epitaxial layer 148a, the second epitaxial layer 148b, and the third epitaxial layer 148c sequentially formed on the second lower region 146. The first stressor 147 may constitute the first source/drain region in the logic region 110. The second stressor 148 may constitute the second source/drain region 148 in the memory region 120.

In an example embodiment, each of the first through third epitaxial layers 147a, 147b, 147c, 148a, 148b and 148c may include a single crystal SiGe. A silicon content of each of the first epitaxial layers 147a and 148a may be greater than a silicon content of each of the second epitaxial layers 147b and 148b and may be less than a silicon content of each of the third epitaxial layers 147c and 148c.

In an example embodiment, the first through third epitaxial layers 147a, 147b, 147c, 148a, 148b and 148c may include an elevated Si layer doped with impurities.

In an example embodiment, the first stressor 147 may be in contact with another adjacent first stressor 147. The second stressor 148 may be spaced apart from another adjacent second stressor 148 by the insulating fence pattern 154 of the second device isolation layer pattern 152 interposed therebetween. The second stressor 148 may cover a sidewall of the second device isolation layer pattern 152. For example, the second stressor 148 may cover, e.g., overlap, a sidewall of the insulating fence pattern 154.

Next, the lower interlayer insulating layer 174 may be formed on the substrate 130. The lower interlayer insulating layer 174 may include silicon oxide.

Figure 13A:
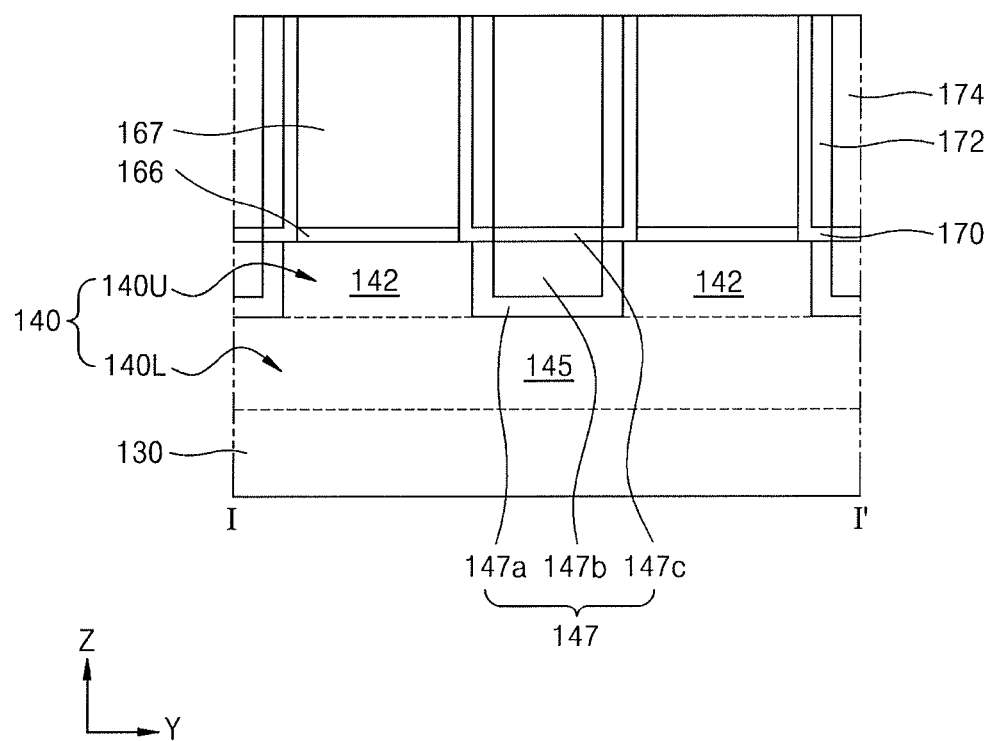
Figure 13B:
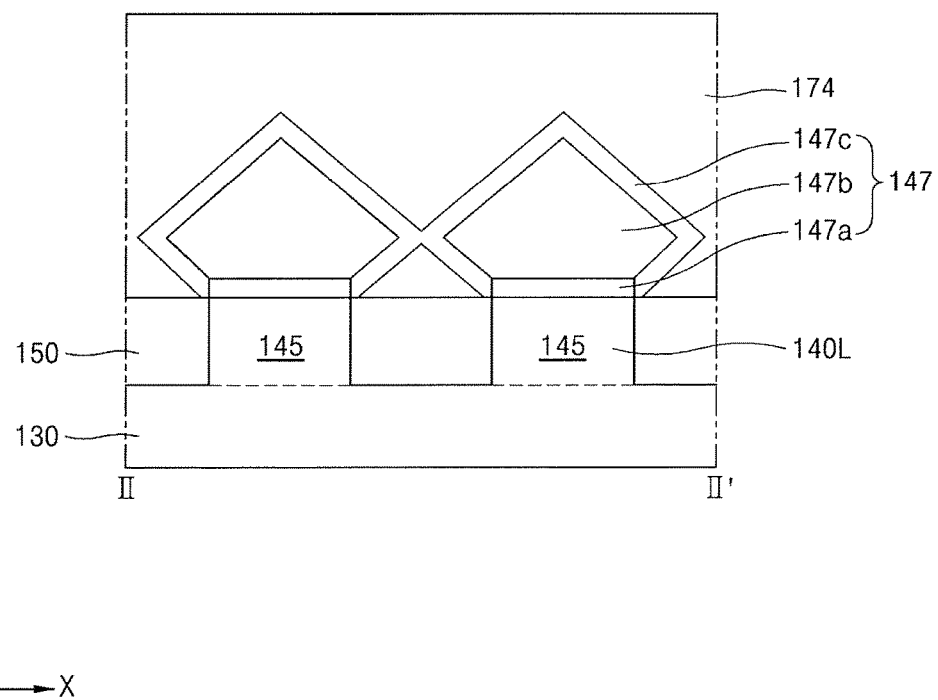
Figure 13C:
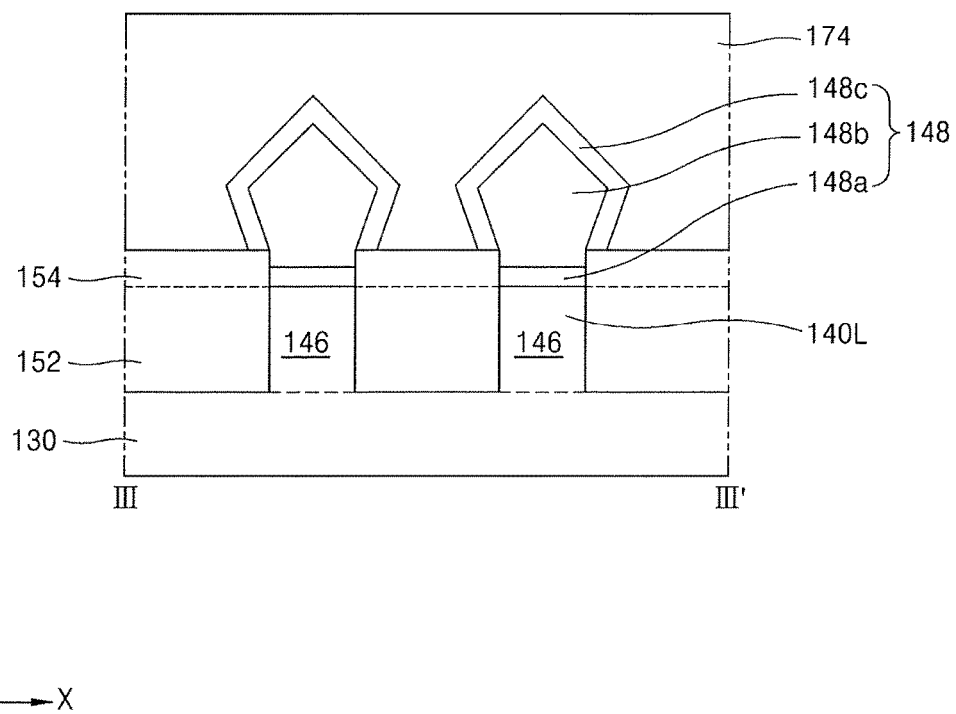

Referring to FIGS. 13A through 13C, an upper portion of the lower interlayer insulating layer 174 and the sacrificial gate capping pattern 168 may be removed by performing a planarization process (e.g., CMP process) until a top surface of the sacrificial gate electrode pattern 167 is exposed. At this time, respective upper portions of the inner spacer 170 and the outer spacer 172 may be removed. Accordingly, the top surface of the sacrificial gate electrode pattern 167, a top surface of the inner spacer 170, a top surface of the outer spacer 172 and a top surface of the lower interlayer insulating layer 174 may be coplanar.

Figure 14A:
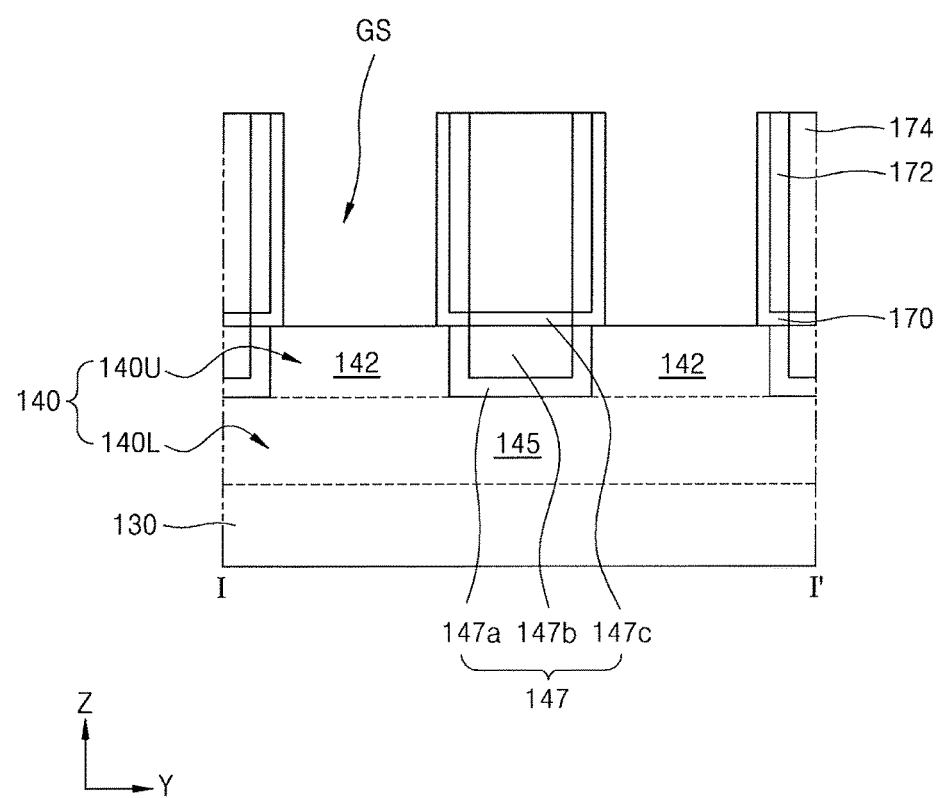
Figure 14B:
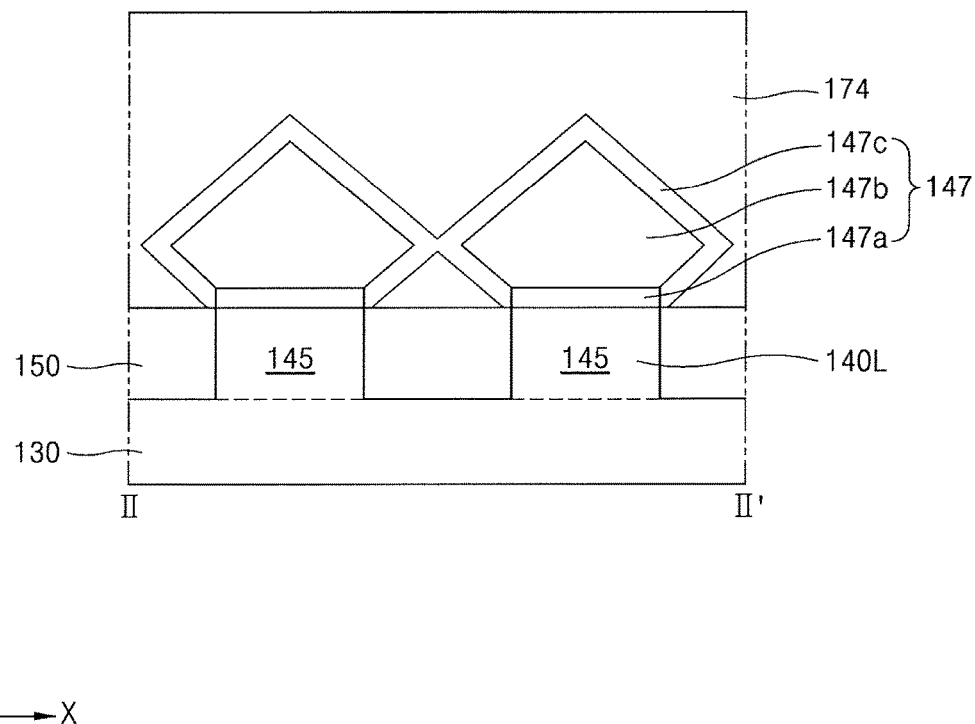
Figure 14C:
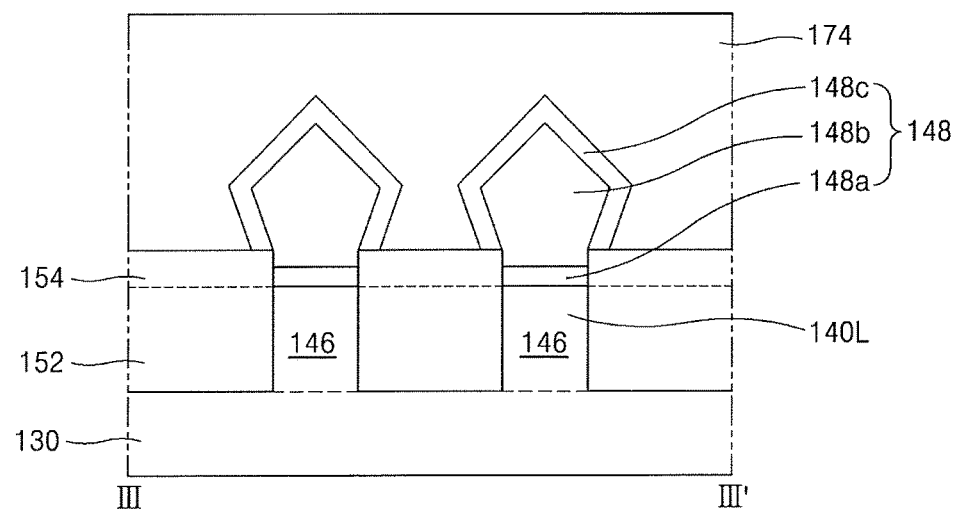

Referring to FIGS. 14A through 14C, a gate pattern space GS may be formed by removing the exposed sacrificial gate electrode pattern 167 and the sacrificial gate insulation layer pattern 166 using an etching process until inner sidewalls of the inner spacer 170 and the top surface of the upper fin active region 140U are exposed.

Figure 15A:
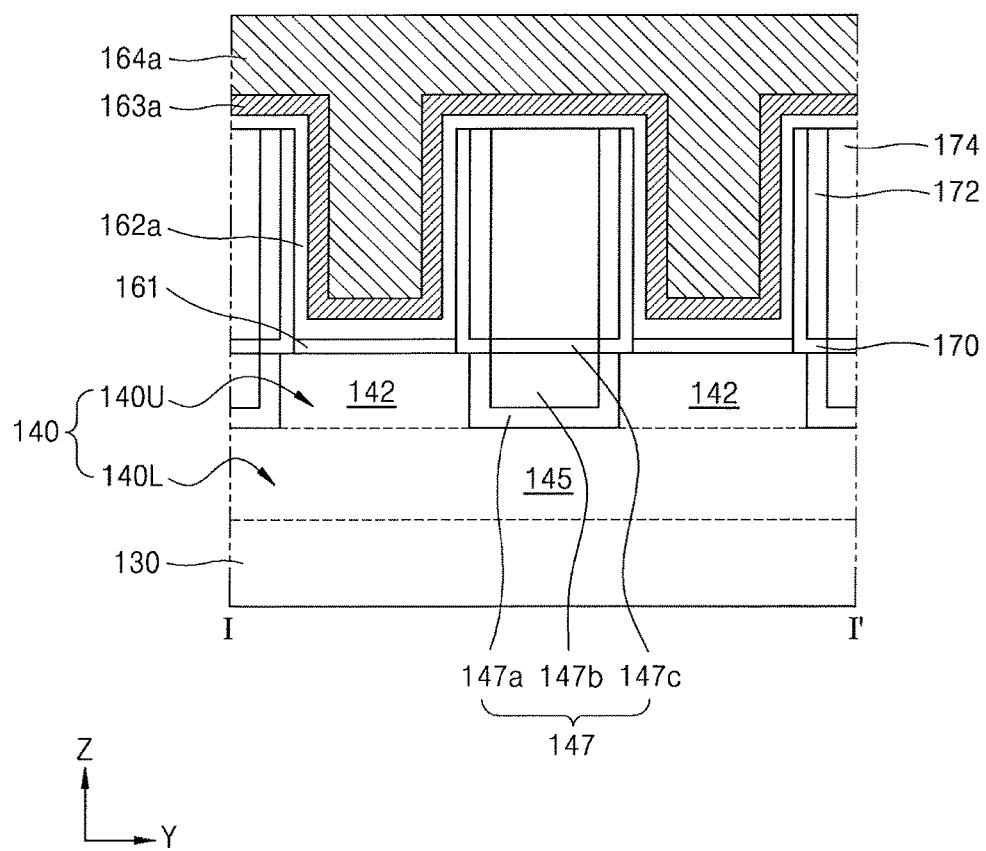
Figure 15B:
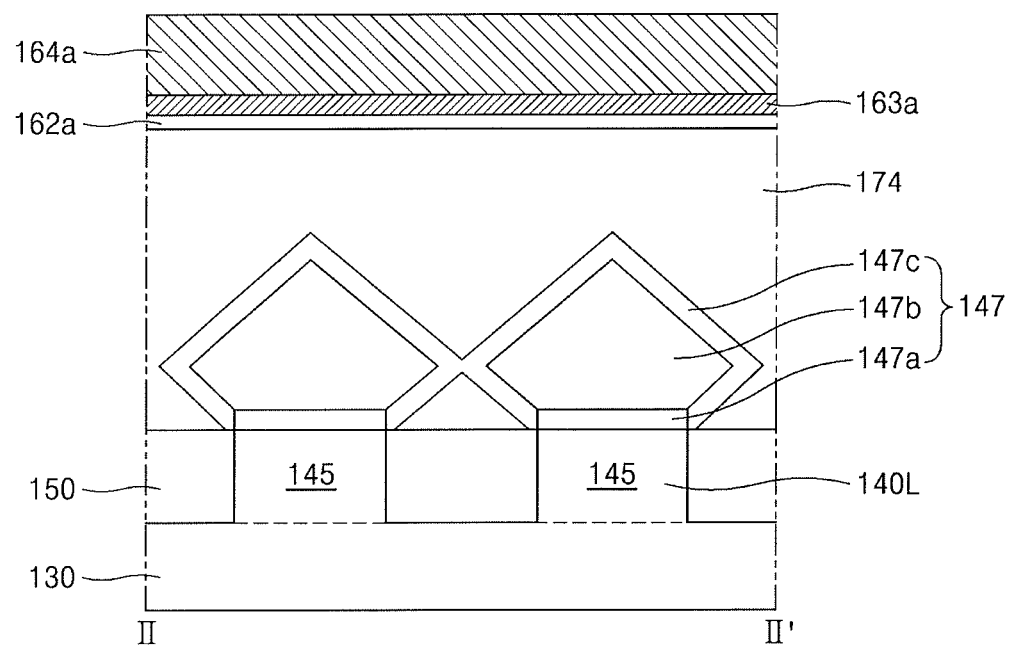
Figure 15C:
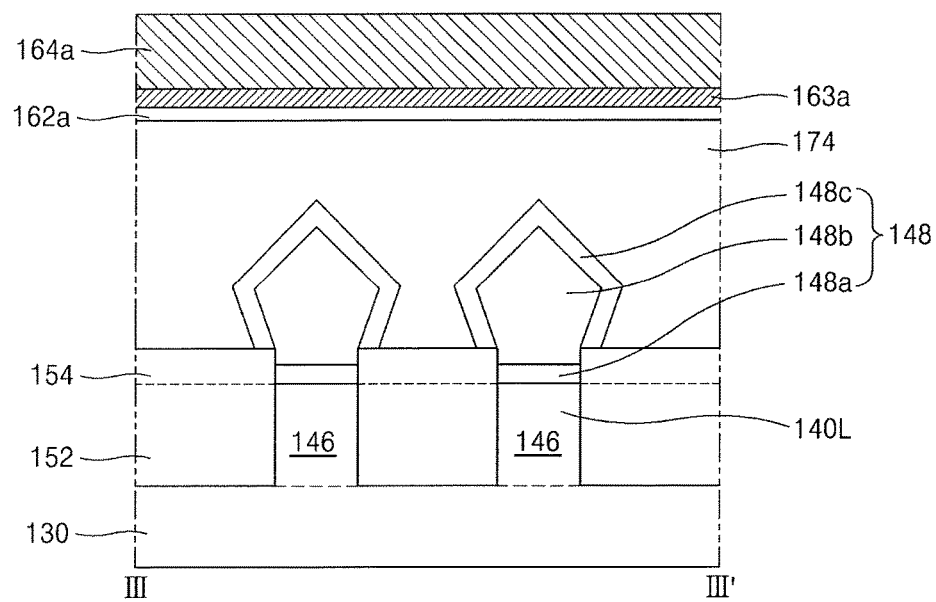

Referring to FIGS. 15A through 15C, a surface insulation layer pattern 161, a gate insulation layer 162a, a gate barrier layer 163a and a gate electrode layer 164a may be sequentially formed on the substrate 130 including the gate pattern space GS.

The surface insulation layer pattern 161 may include a native oxide formed by oxidizing a surface of the upper fin active region 140U, a thermal oxide, an ALD oxide, or a combination thereof.

The gate insulation layer 162a may be conformally formed on a top surface of the surface insulation layer pattern 161, the top surface and inner sidewalls of the inner spacer 170, the top surface of the outer spacer 172 and the top surface of the lower interlayer insulating layer 174. The gate insulation layer 162a may include a high-k dielectric metal oxide (e.g., hafnium oxide or zirconium oxide).

The gate barrier layer 163a may be conformally formed on the gate insulation layer 162a. The gate barrier layer 163a may include titanium (Ti), titanium nitride (TiN), tantalum (Ta), tantalum nitride (TaN), titanium tungsten (TiW) or a combination thereof.

The gate electrode layer 164a may fill the gate pattern space GS on the gate barrier layer 163a. The gate electrode layer 164a may include tungsten (W).

Referring again to FIGS. 3A through 3C, the gate insulation layer pattern 162, the gate pattern 160 including the gate barrier layer pattern 163, and the gate electrode pattern 164 may be formed by partially removing the gate electrode layer 164a, the gate barrier layer 163a and the gate insulation layer 162a through a planarization process (e.g., CMP process) until the top surface of the lower interlayer insulating layer 174 is exposed.

Next, the stopper layer 175 and the upper interlayer insulating layer 180 may be sequentially formed on the gate pattern 160 and the lower interlayer insulating layer 174. The stopper layer 175 may include silicon nitride (SiN) and the upper interlayer insulating layer 180 may include silicon oxide.

According to example embodiments, by increasing a volume of a stressor, electrical characteristics of a semiconductor device may improve. Furthermore, by forming an insulating fence pattern between adjacent stressors, an electrical short therebetween may be prevented.

Figure 16:
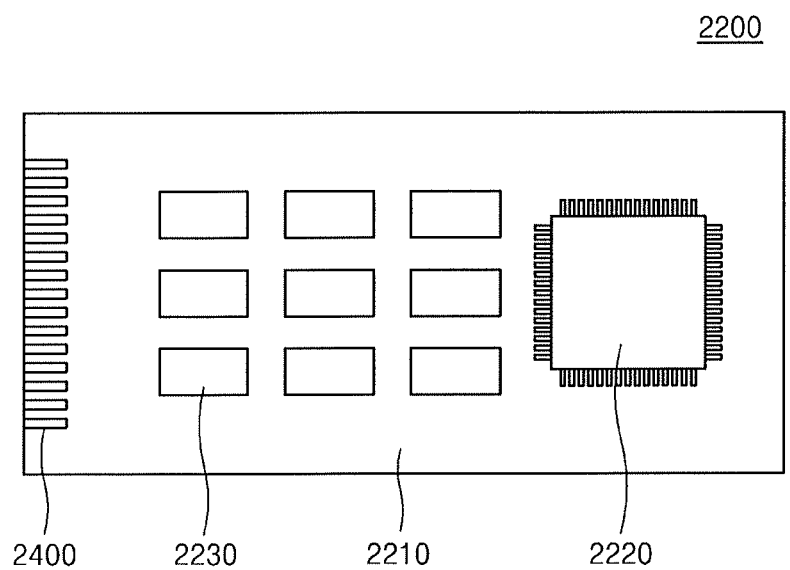
FIG. 16 illustrates a connectional view of a semiconductor module including at least one of the semiconductor devices in accordance with example embodiments.

FIG. 16 is a view conceptually showing a semiconductor module 2200 in accordance with an embodiment. Referring to FIG. 16, the semiconductor module 2200 may include a processor 2220 and a plurality of semiconductor devices 2230 mounted on a module substrate 2210. The processor 2220 and/or the semiconductor devices 2230 may include the semiconductor device 100 according to example embodiments. Conductive input/output terminals 2240 may be disposed on at least one side of the module substrate 2210.

Figure 17:
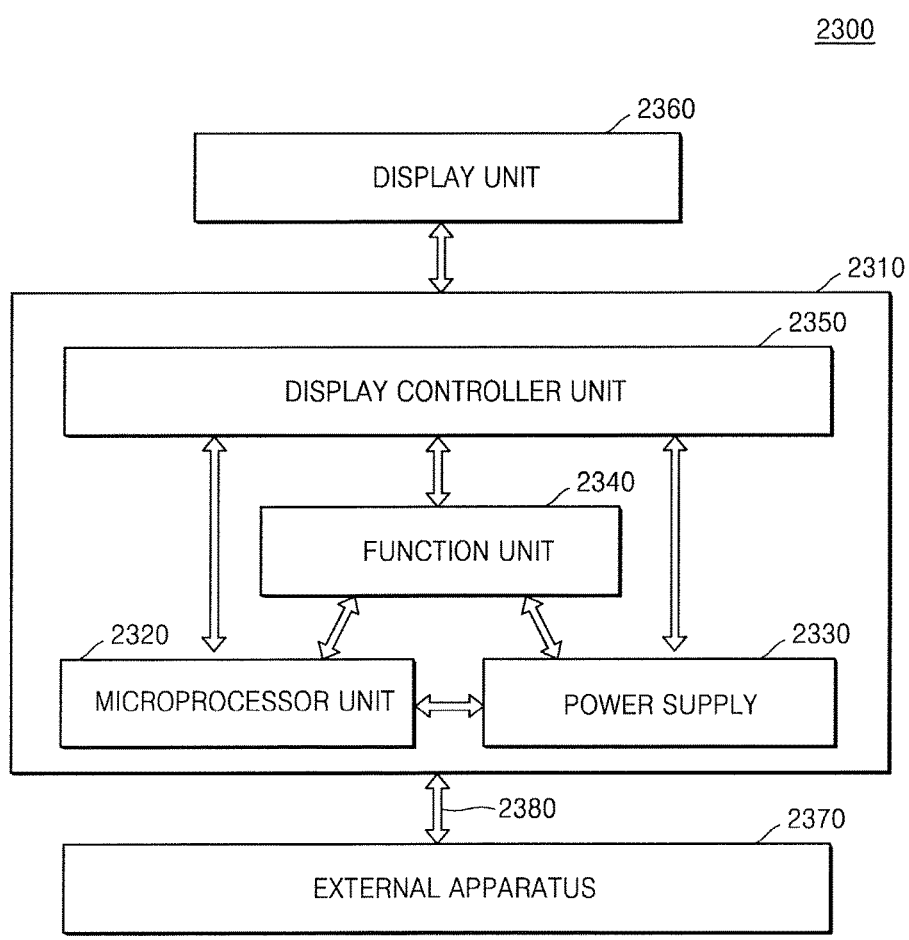
FIGS. 17 and 18 illustrate block diagrams conceptually showing electronic systems according to example embodiments.
Figure 18:
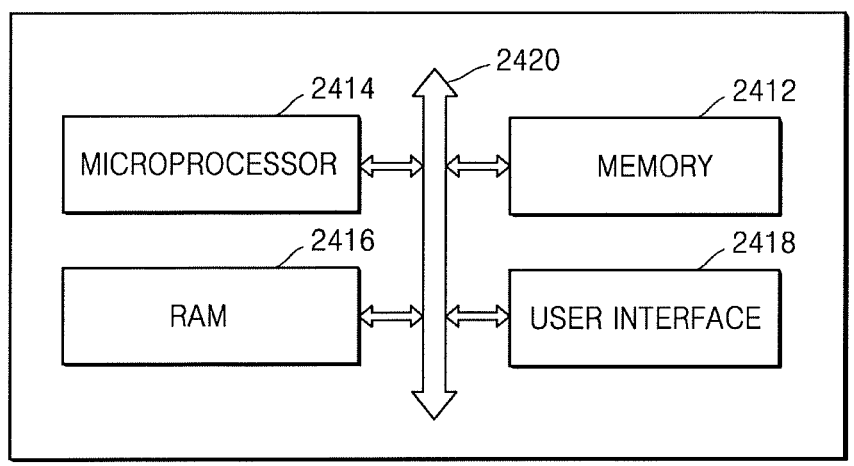

FIGS. 17 and 18 are block diagrams conceptually showing electronic systems according to example embodiments. Referring to FIG. 17, an electronic system 2300 in accordance with an example embodiment may include a body 2310, a display unit 2360, and an external device 2370.

The body 2310 may include a microprocessor unit 2320, a power supply 2330, a function unit 2340, and/or a display controller unit 2350. The body 2310 may be a system board or a motherboard including a printed circuit board (PCB) and/or a case. The microprocessor unit 2320, the power supply 2330, the function unit 2340, and the display controller unit 2350 may be mounted or disposed on a top surface or inside of the body 2310.

The display unit 2360 may be disposed on the top surface of the body 2310 or inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc.

The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include, e.g., a touch-pad, a touch-screen, a volatile/non-volatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include the semiconductor device 100 according to example embodiments.

Referring to FIG. 18, an electronic system 2400 in accordance with an example embodiment may include a microprocessor 2414, a memory system 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory system 2412 may store codes for operating the microprocessor 2414, data processed by the microprocessor 2414, or external input data. The memory system 2412 may include a memory controller, a hard disk, or a solid state drive (SSD). The microprocessor 2414, the RAM 2416 and/or the memory system 2412 may include the semiconductor device 100 according to example embodiments.

By way of summation and review, electrical characteristics of the semiconductor device vary in accordance with a volume of a stressor. In other words, an increase in the volume of the stressor improves the electrical characteristics of the semiconductor device. However, when the volume of the stressor increases, an electrical short between adjacent stressors may be induced.

In contrast, according to example embodiments, a semiconductor device includes an insulating fence pattern between adjacent stressors. As such, a volume of a stressor may be increased to improve electrical characteristics without inducing an electrical short between the adjacent stressors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
a fin active region pattern on the substrate, the fin active region pattern including an upper region and a lower region;
a device isolation layer pattern surrounding the fin active region pattern;
a gate pattern on the upper region of the fin active region pattern; and
a stressor on the lower region of the fin active region pattern, at least two lateral sidewalls of a lower part of the stressor being level with corresponding lateral sidewalls of the lower region of the fin active region pattern,
wherein a top surface of the device isolation layer pattern is lower than a top surface of the upper region and higher than a top surface of the lower region,
wherein the device isolation layer pattern has a first portion of a surface contacting the lower region, a second portion of the surface contacting the upper region, and a third portion of the surface contacting the stressor, the third portion of the surface being flat and covering an entirety of the at least two lateral sidewalls of the lower part of the stressor that are level with the lower region of the fin active region pattern, and
wherein the stressor includes:

a first stressor portion directly on the lower region of the fin active region pattern and contacting the third portion of the surface of the device isolation layer pattern, and a second stressor portion directly on the first stressor portion and contacting the third portion of the surface of the device isolation layer pattern, lateral sidewalls of the first and second stressor portions defining the at least two lateral sidewalls of the lower part of the stressor that are level with the lower region of the fin active region pattern, and the first and second stressor portions having different silicon contents.

2. The device as claimed in claim 1, wherein the stressor is on the lower region adjacent to the device isolation layer pattern and is spaced apart from another adjacent stressor by the device isolation layer pattern interposed therebetween.

3. The device as claimed in claim 1, wherein:
the lower region of the fin active region pattern is surrounded by the device isolation layer pattern and the upper region of the fin active region pattern protrudes above the top surface of the device isolation layer pattern, and
the gate pattern contacts the top surface and sidewalls of the upper region and extends above the device isolation layer pattern.

4. The device as claimed in claim 1, wherein a top surface of the device isolation layer pattern adjacent to the upper region is disposed at a substantially same height as a top surface of the device isolation layer pattern adjacent to the lower region.

5. The device as claimed in claim 1, wherein the top surface of the upper region is higher than the top surface of the lower region to have the fin active region pattern be a step structure, and a top surface of the stressor is higher than the top surface of the device isolation layer pattern.

6. The device as claimed in claim 1, wherein the upper region of the fin active region pattern, the stressor, and the gate pattern constitute a PMOS transistor of a static random-access memory (SRAM) device.

7. The device as claimed in claim 1, wherein:
the silicon content of the first stressor portion is larger than the silicon content of the second stressor portion, and
the stressor further includes a third stressor portion directly on the second stressor portion and contacting a top surface of the device isolation layer pattern, a silicon content of the third stressor portion being larger than the silicon content of the first stressor portion.

8. A semiconductor device, comprising:
a substrate including a first region and a second region;
a plurality of first fin active region patterns in the first region, each of the plurality of first fin active region patterns including a first upper region and a first lower region;
a plurality of second fin active region patterns in the second region, each of the plurality of second fin active region patterns including a second upper region and a second lower region;
a first device isolation layer pattern surrounding the first fin active region patterns;
a second device isolation layer pattern surrounding the second fin active region patterns;
a first stressor only on an upper surface of the first lower region among upper surfaces of the first lower and upper regions; and
a second stressor only on an upper surface of the second lower region among upper surfaces of the second lower and upper regions,
wherein a top surface of the first device isolation layer pattern is substantially coplanar with a top surface of the first lower region, and a top surface of the second device isolation layer pattern is higher than a top surface of the second lower region.

9. The device as claimed in claim 8, wherein the top surface of the first device isolation layer pattern is lower than a top surface of the first upper region, the top surface of the second device isolation layer pattern is lower than a top surface of the second upper region, the top surface of the first upper region is substantially coplanar with the top surface of the second upper region, and the top surface of the first device isolation layer pattern is lower than the top surface of the second device isolation layer pattern.

10. The device as claimed in claim 8, wherein:
the first lower region of the first fin active region pattern is surrounded by the first device isolation layer pattern, and the first upper region of the first fin active region pattern protrudes above the top surface of the first device isolation layer pattern,
the second lower region of the second fin active region pattern is surrounded by the second device isolation layer pattern, and the second upper region of the second fin active region pattern protrudes above the top surface of the second device isolation layer pattern, and
the first upper region has a first fin height from the top surface of the first upper region to the top surface of the first device isolation layer pattern, and the second upper region has a second fin height from the top surface of the second upper region to the top surface of the second device isolation layer pattern, and the second fin height being less than the first fin height.

11. The device as claimed in claim 10, further comprising:
a first gate pattern on the first upper region; and
a second gate pattern on the second upper region,
wherein the first gate pattern contacts the top surface and sidewalls of the first upper region and extends above the first device isolation layer pattern, and the second gate pattern contacts the top surface and sidewalls of the second upper region and extends above the second device isolation layer pattern.

12. The device as claimed in claim 8, wherein:
the first stressor is on the first lower region adjacent to the first device isolation layer pattern and contacts another adjacent first stressor, and
the second stressor is on the second lower region adjacent to the second device isolation layer pattern and is spaced apart from another adjacent second stressor by the second device isolation layer pattern interposed therebetween.

13. The device as claimed in claim 8, wherein:
a top surface of the first upper region is higher than the top surface of the first lower region, and a top surface of the first stressor is higher than the top surface of the first device isolation layer pattern, and
a top surface of the second upper region is higher than the top surface of the second lower region, and a top surface of the second stressor is higher than the top surface of the second device isolation layer pattern.

14. The device as claimed in claim 8, wherein the first region includes a PMOS transistor region of a logic device, and the second region includes a PMOS transistor region of a static random-access memory (SRAM) device.

15. The device as claimed in claim 8, wherein the top surface of the first lower region is at substantially the same height as the top surface of the second lower region.

16. A semiconductor device, comprising:
- a substrate;
- a fin active region pattern on the substrate along a first direction, the fin active region pattern including an upper region and a lower region;
- a device isolation layer pattern surrounding the fin active region pattern, a top surface of the device isolation layer pattern being lower than a top surface of the upper region and higher than a top surface of the lower region;
- a gate pattern on the upper region of the fin active region pattern; and
- a stressor on the lower region of the fin active region pattern, the stressor being between two portions of the device isolation layer pattern that are spaced apart from each other along a second direction perpendicular to the first direction, at least two lateral sidewalls of a lower part of the stressor being level with corresponding lateral sidewalls of the lower region of the fin active region pattern,
- wherein the device isolation layer pattern has a first portion of a surface contacting the lower region, a second portion of the surface contacting the upper region, and a third portion of the surface contacting the stressor, the third portion of the surface being flat and extending along and in direct contact with the lateral sidewalls of the lower part of the stressor, and
- wherein the stressor includes:
  - a first stressor portion directly on the lower region of the fin active region pattern and contacting the third portion of the surface of the device isolation layer pattern, and
  - a second stressor portion directly on the first stressor portion and contacting the third portion of the surface of the device isolation layer pattern, lateral sidewalls of the first and second stressor portions defining the at least two lateral sidewalls of the lower part of the stressor that are level with the lower region of the fin active region pattern, and the first and second stressor portions having different silicon contents.

17. The device as claimed in claim 16, wherein the upper and lower regions of the fin active region pattern alternate along the first direction, a portion of the device isolation layer pattern extending above the lower region to at least partially overlap the stressor.

18. The device as claimed in claim 16, wherein the device isolation layer pattern extends along the first direction to contact opposite sidewalls of the fin active region pattern, the stressor being surrounded by the device isolation layer pattern and the upper region of the fin active region pattern.

19. The device as claimed in claim 16, wherein a plurality of stressors and portions of the device isolation layer pattern alternate along the second direction.

20. The device as claimed in claim 19, wherein a portion of the device isolation layer pattern overlapping the stressor separates two stressors adjacent to each other along the second direction.

* * * * *